United States Patent
Ifuku et al.

(10) Patent No.: US 7,622,852 B2
(45) Date of Patent: Nov. 24, 2009

(54) PIEZOELECTRIC MEMBER, PIEZOELECTRIC ELEMENT, AND LIQUID DISCHARGE HEAD AND LIQUID DISCHARGE APPARATUS UTILIZING PIEZOELECTRIC ELEMENT

(75) Inventors: Toshihiro Ifuku, Yokohama (JP); Tetsuro Fukui, Yokohama (JP); Kenichi Takeda, Yokohama (JP); Hiroshi Funakubo, Yokohama (JP); Hiroshi Nakaki, Yokohama (JP); Rikyu Ikariyama, Yokohama (JP); Osami Sakata, Sayo-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 157 days.

(21) Appl. No.: 12/031,176

(22) Filed: Feb. 14, 2008

(65) Prior Publication Data
US 2008/0211881 A1 Sep. 4, 2008

(30) Foreign Application Priority Data
Mar. 2, 2007 (JP) .............................. 2007-053507

(51) Int. Cl.
H01L 41/04 (2006.01)
H01L 41/187 (2006.01)

(52) U.S. Cl. .............................. 310/358; 252/62.9 PZ; 501/134

(58) Field of Classification Search ................. 310/358; 252/62.9 R, 62.9 PZ; 501/134
See application file for complete search history.

(56) References Cited

U.S. PATENT DOCUMENTS 5,998,910 A * 12/1999 Park et al. .................... 310/358
6,198,208 B1 * 3/2001 Yano et al. .................. 310/358
7,015,628 B2 3/2006 Matsushita et al.
7,144,101 B2 12/2006 Ifuku et al.
7,185,540 B2 * 3/2007 Torii et al. ................ 73/504.16

(Continued)

FOREIGN PATENT DOCUMENTS

JP 10-45470 2/1998

(Continued)

OTHER PUBLICATIONS

Wada, et al., "Enhanced Piezoelectric Property of Lead-free Piezoelectric Single Crystal by Domain Engineering", vol. 40, No. 8, 2005, pp. 598-603. (with partial translation).

(Continued)

Primary Examiner—J. SanMartin
(74) Attorney, Agent, or Firm—Fitzpatrick, Cella, Harper & Scinto

(57) ABSTRACT

The invention provides a piezoelectric film having a large piezoelectric property, and a piezoelectric element, a liquid discharge head and a liquid discharge apparatus utilizing the same. The piezoelectric film is formed by an epitaxial oxide of <100> orientation having at least a tetragonal crystal structure, in which the oxide is a perovskite type composite oxide represented by a general formula $ABO_3$ and contains at least domains C, D and E of [100] orientation having mutual deviation in crystal direction, where the angular deviation between [100] directions in domains C and D, in domains D and E, in domains C and E and in domains D and E are respectively 5° or less, 5° or less, 0.3° or less, and 0.3° or more, and the angular deviation between [001] directions in domains C and E and in domains D and E are respectively 1.0° or more, and 1.0° or more.

9 Claims, 17 Drawing Sheets

U.S. PATENT DOCUMENTS

| | | | |
|---|---|---|---|
| 7,287,840 B2 * | 10/2007 | Miyazawa et al. | 347/68 |
| 7,312,558 B2 * | 12/2007 | Fujii et al. | 310/358 |
| 7,478,558 B2 * | 1/2009 | Fujii et al. | 73/504.16 |
| 2006/0049723 A1 | 3/2006 | Okabe et al. | |
| 2006/0093841 A1 * | 5/2006 | Park et al. | 428/472 |
| 2007/0060467 A1 * | 3/2007 | Matsuda et al. | 501/134 |
| 2007/0090730 A1 | 4/2007 | Fukui et al. | |
| 2007/0236104 A1 * | 10/2007 | Fujii | 310/358 |
| 2008/0012054 A1 * | 1/2008 | Ifuku et al. | 257/295 |
| 2008/0074471 A1 * | 3/2008 | Sakashita et al. | 347/68 |
| 2009/0128608 A1 * | 5/2009 | Fukui | 347/68 |

FOREIGN PATENT DOCUMENTS

| | | |
|---|---|---|
| JP | 3397538 | 2/2003 |
| JP | 2004-249729 | 9/2004 |
| JP | 2005-5698 | 1/2005 |

OTHER PUBLICATIONS

"Ceramics Dielectric Substance Engineering", 4th edition, 1992, pp. 332-335. (with partial translation).

Singh, et al., "Crystalline Properties of Ferroelectric—Relaxor PMN-PT Thin Films by Pulsed Laser Deposition", Applications of Ferroelectrics, ISAF, Proceedings of the 13th IEEE International Symposium, 2002, pp. 133-136.

Smits, et al., "The Constituent Equations of Piezoelectric Heterogeneous Bimorphs", IEEE Transactions of Ultrasonics, Ferroelectrics and Frequency Control, vol. 38, No. 3, May 1991, pp. 256-270.

* cited by examiner

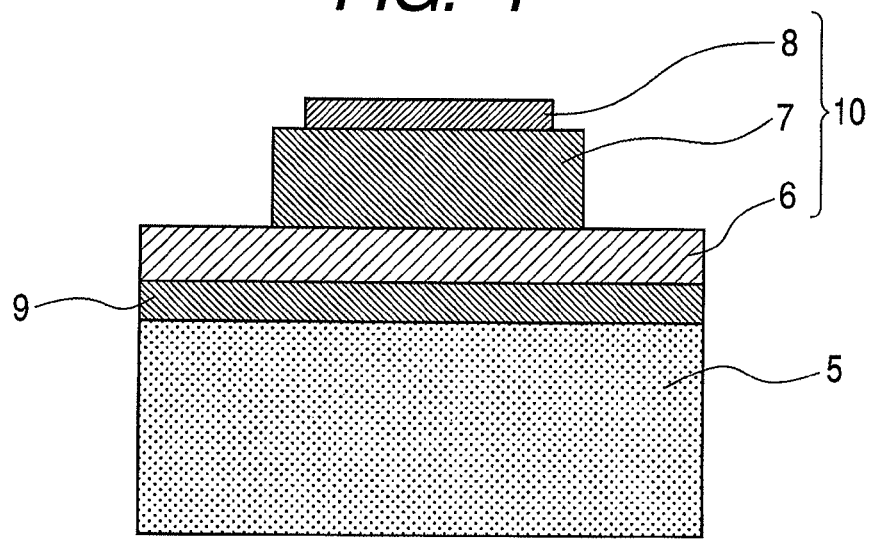
FIG. 1
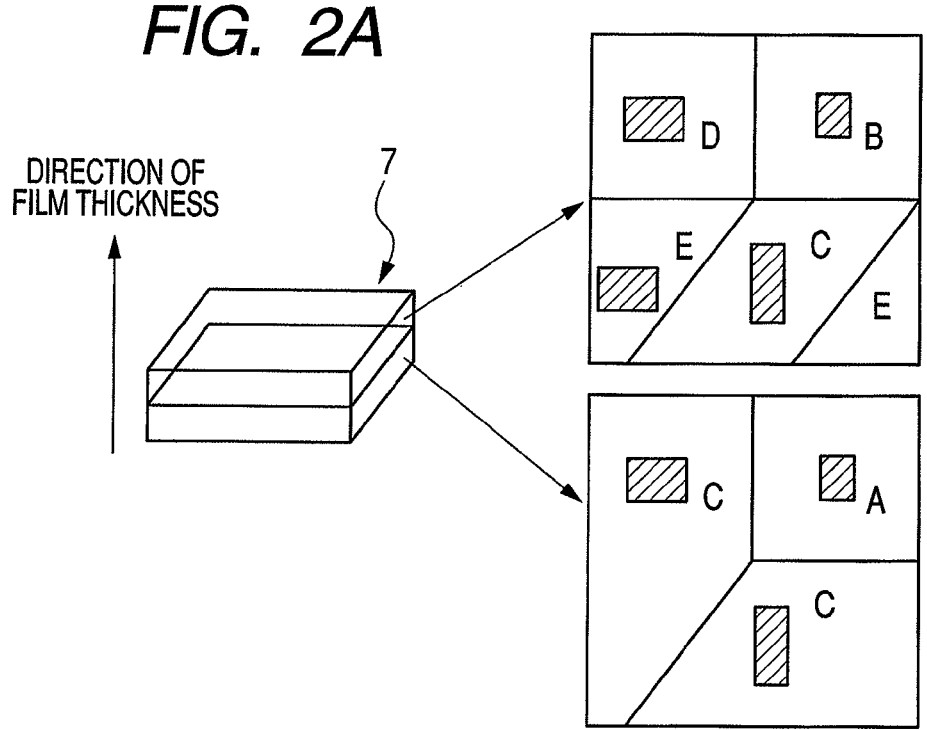
FIG. 2A
FIG. 2B

DIRECTION OF FILM THICKNESS

CONFIGURATION LESS THAN FILM THICKNESS OF 0.6 μm

CONFIGURATION NOT LESS THAN FILM THICKNESS OF 600 μm

MIRROR IMAGE RELATION OF TWIN CRYSTAL

FIG. 12A
FIG. 12B
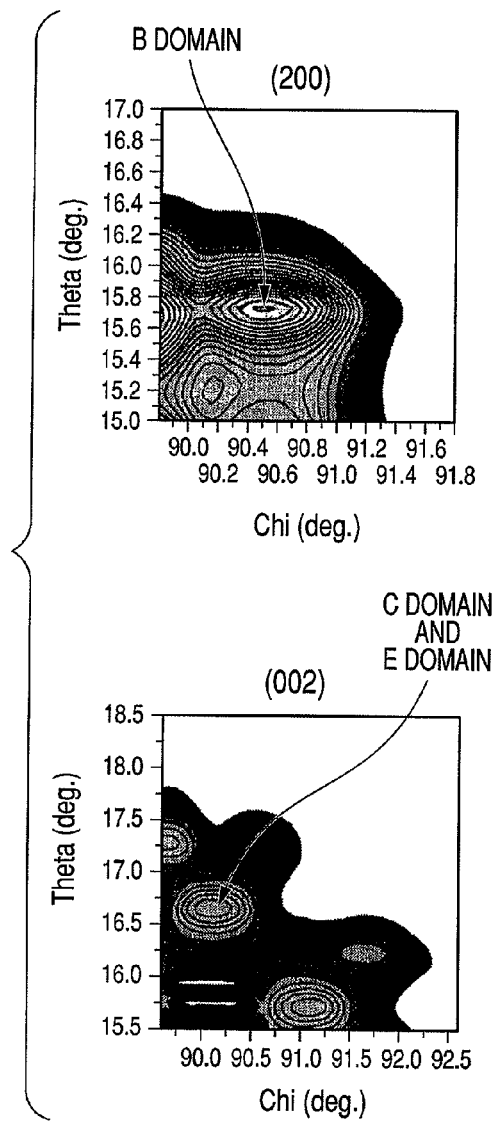
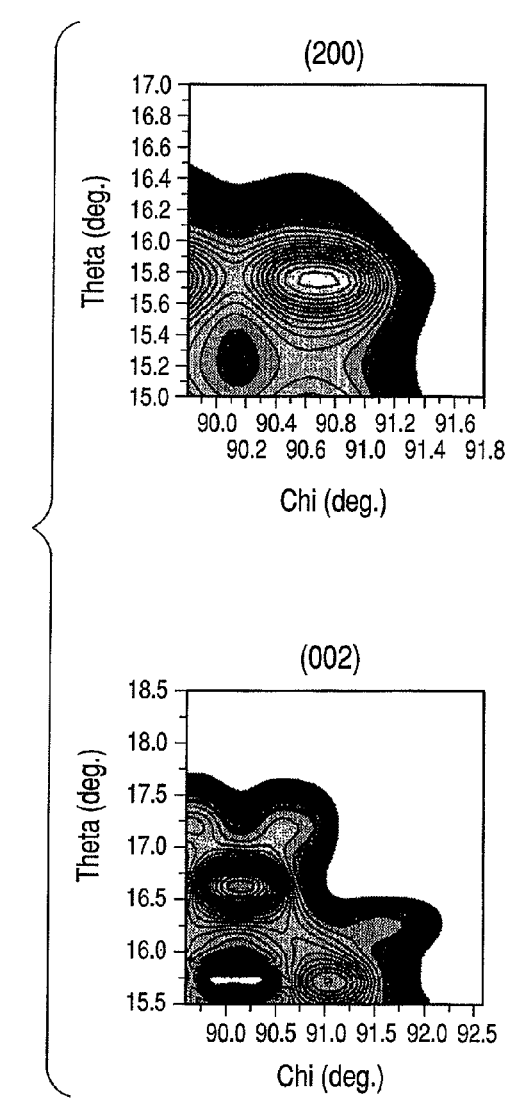

PIEZOELECTRIC MEMBER, PIEZOELECTRIC ELEMENT, AND LIQUID DISCHARGE HEAD AND LIQUID DISCHARGE APPARATUS UTILIZING PIEZOELECTRIC ELEMENT

BACKGROUND OF THE INVENTION

1. Field of the Invention

The present invention relates to a piezoelectric member, a piezoelectric element, and a liquid discharge head and a liquid discharge apparatus utilizing the piezoelectric element.

2. Description of the Related Art

Recently, piezoelectric actuators are attracting attention, in the fields of mobile information equipment, chemistry and medical technology, as a novel motor replacing the electromagnetic motor, as it enables miniaturization and higher density in the motor structure. The piezoelectric actuator, in the driving thereof, does not generate electromagnetic noises and is not influenced by external noises. Also the piezoelectric actuator is attracting attention as a technology of realizing equipment of a submillimeter size as represented by micromachines, and a very small piezoelectric element is required as a driving source therefor.

In general, a piezoelectric element has a construction in which a pair of electrodes is connected to a piezoelectric member. The piezoelectric member is generally produced from a material having piezoelectric property such as a sintered member of a heat treated bulk material or a single crystal member, by forming into a small size of desired dimension and thickness by working technologies such as cutting and polishing. Also for producing a minute piezoelectric element, employed generally is a method of coating the piezoelectric member in a state of a green sheet for example by a printing method in a predetermined position on a substrate such as a metal or silicon and sintering such piezoelectric member thereby directly preparing a piezoelectric element. The member formed from such green sheet generally has a thickness of from tens to hundreds of micrometers, and, on and under the piezoelectric member, disposed are electrodes through which a voltage is applied.

Conventionally, a piezoelectric member to be used in a small piezoelectric element, as employed in a liquid discharge head, has also been produced from the aforementioned material by forming into a small form with working technologies such as cutting and polishing or from a piezoelectric member of the green sheet state. Examples of the apparatus utilizing such piezoelectric element include a liquid discharge head having a unimorph type piezoelectric element structure. The liquid discharge head is equipped with a pressure chamber communicating with an ink supply chamber and an ink discharge port communicating with the pressure chamber, with a vibrating plate, on which a piezoelectric element is adjoined or formed directly, equipped in the pressure chamber. In such construction, a predetermined voltage is applied to the piezoelectric element to cause an extension-contraction deformation therein thereby inducing a bending vibration and pressurizing the ink in the pressure chamber, thus discharging an ink liquid droplet from the ink discharge port.

Color ink jet printers utilizing the aforementioned function of the piezoelectric member are currently popular, but, also for such printers of piezoelectric type, desired are improvements in the printing ability, in particularly a higher resolution and a higher printing speed. For this reason, it has been tried to realize a higher resolution and a higher printing speed by miniaturizing the liquid discharge head to attain a multi-nozzle head structure. For the miniaturization of the liquid discharge head, a further miniaturization in the piezoelectric element for ink discharge is necessary. Also attempts are being actively made in applying the liquid discharge head in industrial applications such as directly drawing of a wiring. For such applications, being required is a liquid discharge head having more diversified characteristics with a miniaturization and a higher performance in the structure of the element structure for generating the discharge pressure.

Together with the recent advancement in the micromachine technologies, researches are being made for developing an ultra-small piezoelectric element of a higher precision by forming the piezoelectric member as a thin film and by utilizing the fine working technologies developed in the semiconductor field. The piezoelectric film, formed by a thin film forming method such as a sputtering method, a chemical vapor deposition method, a sol-gel method, a gas deposition method, or a pulsed laser deposition method, has a thickness of from about hundreds of nanometers to tens of micrometers in case of application to a piezoelectric actuator. Electrodes are connected to such piezoelectric film for applying a voltage.

On the other hand, with the compactification of the piezoelectric element, actively researched also are high-performance piezoelectric materials showing stronger piezoelectric characteristics. A piezoelectric material attracting attention recently is a composite oxide material having a perovskite type structure represented by a general formula $ABO_3$. Such material, as represented by $Pb(Zr_xTi_{1-x})O_3$ (lead zirconate titanate: PZT), is excellent in dielectric property, pyroelectric property and piezoelectric property. Examples of the PZT material include those described in Non-patent Reference 1.

It is generally considered that a high piezoelectric property can be obtained by applying an electric field in a direction of spontaneous polarization of a piezoelectric member formed by a bulk single crystal, but, as a method for improving the piezoelectric property of the piezoelectric material, researches are being made on a domain control, called domain engineering. For example, a particularly excellent piezoelectric property is exhibited by relaxer type single crystal materials as represented for example by $[Pb(Mg_{1/3}Nb_{2/3})O_3]_{1-x}$—$(PbTiO_3)_x$ (lead magnesate niobate titanate: PMN-PT) and $[Pb(Zn_{1/3}Nb_{2/3})O_3]_{1-x}$—$(PbTiO_3)_x$ (lead zincate niobate titanate: PZN-PT). For example the Patent Reference 1 discloses a method of synthesizing PMN-PT by flux melting. It is reported that a bulk single crystal member was obtained by such synthesis and a material having a large strain amount exceeding 1% could be obtained. Also Non-patent Reference 2 reports that a domain control, called engineered domain structure, on PZN-PT could obtain a piezoelectric constant of 30 times or more (2500-2800 µC/N) of the piezoelectric constant $d_{33}$ in the direction of spontaneous polarization. However, such bulk piezoelectric member has to be formed into a small size by the aforementioned technologies of cutting and polishing, and is difficult to apply to an ultra-small piezoelectric element of a higher precision.

It is therefore investigated to form such piezoelectric member as a film by a thin film forming method such as a sputtering method, a chemical vapor deposition method, a sol-gel method, a gas deposition method or a pulsed laser deposition method. However, even with the material of the high piezoelectric property as described above, the piezoelectric member (piezoelectric film) prepared by the thin film forming method has often not realized a high piezoelectric property as anticipated, with a significant difference.

It is also investigated to form a piezoelectric film of a relaxer type material by a thin film forming method such as a sputtering method, a chemical vapor deposition method, a sol-gel method, a gas deposition method or a pulsed laser deposition method. For example Non-patent Reference 3 reports that a PMN-PT thin film was formed by the PLD method.

Also as another method of domain control called domain engineering, investigated is an attempt to obtain a piezoelectric deviation larger than the polarization deviation inherent to the material itself, based on a rotation of a domain that is not horizontal to the electric field (for example a domain having a polarization in a substantially perpendicular direction) in the polarization direction. Such rotation of the polarization direction is generally called a 90° domain switching. For example, in a piezoelectric film of <100> orientation, there exists a phenomenon that a domain of [100] orientation is switched to a domain of [001] orientation by an electric field application in the film thickness direction. However, a very high energy is required for expressing such piezoelectric deviation and it is difficult to switch all the domains of [100] orientation to [001] orientation by the electric field application.

The Non-patent Reference 2 further reports that, as a direction for improving the piezoelectric property by the domain control, a reduction in the domain size is effective. The domain engineering enables to obtain a piezoelectric deviation larger than the polarization deviation inherent to the material itself, based on a phase change in the crystal resulting from an electric field application and on a rotation of the domain that is not horizontal to the electric field (for example domain having a polarization in a substantially perpendicular direction) in the polarization direction. However, a very high energy is required for expressing such piezoelectric deviation. For this reason, in the piezoelectric material utilizing the domain engineering, in order to reduce the energy of the piezoelectric deviation, it is important to have a domain structure that can induce a phase change of the crystal or a domain rotation in the piezoelectric material.

On the other hand, the present inventors have shown, in Patent Reference 2, that a twin crystal structure in the piezoelectric film improves the piezoelectric property and improves the adhesion of the piezoelectric film with the lower or upper electrode. It is estimated, as a reason therefor, the twin crystal structure present in the piezoelectric film may relax an internal stress, generated at the preparation of the material by various methods. It is therefore considered possible to obtain a piezoelectric element exhibiting a piezoelectric property close to that of the piezoelectric member obtained from a bulk material and exhibiting a satisfactory adhesion of the piezoelectric film with the lower or upper electrode.

Patent Reference 1: Japanese Patent 3397538
Patent Reference 2: Japanese Patent Application Laid-Open 2004-249729 (corresponding to U.S. Pat. No. 7,144,101)
Non-patent Reference 1: "Ceramic dielectric engineering" 4th edition, published Jun. 1, 1992, Gakken-sha, p. 333
Non-patent Reference 2: Ceramics, Vol. 40(8), 2005, p. 600
Non-patent Reference 3: Applications of Ferroelectrics, 2002, ISAF 2002, Proceedings of the 13th IEEE International Symposium, p. 133-136

SUMMARY OF THE INVENTION

An object of the present invention is to provide a piezoelectric member solving the aforementioned problems and exhibiting a high piezoelectric property, and a piezoelectric element utilizing the same. Another object of the present invention is to provide a piezoelectric element capable of preventing a electrode peeling principally induced by a large piezoelectric strain or a peeling in case of forming a piezoelectric element directly on a substrate. Still another object of the present invention is to provide a liquid discharge head enabling a miniaturization of a structural pattern constituting an element for generating energy for liquid discharge, such as a piezoelectric element, and a liquid discharge apparatus utilizing the same.

The present invention provides, in an aspect thereof, a piezoelectric member of an epitaxial oxide of <100> orientation having at least a tetragonal crystal structure, constituted of a perovskite type composite oxide represented by a general formula $ABO_3$, which comprises at least domains C, D and E of [100] orientation having a deviation in crystal orientation one another, wherein an angular deviation between a [100] direction of the domain C and a [100] direction of the domain D is 5° or less, an angular deviation between a [100] direction of the domain D and a [100] direction of the domain E is 5° or less, an angular deviation between a [100] direction of the domain C and a [100] direction of the domain E is 0.3° or less, an angular deviation between a [100] direction of the domain D and a [100] direction of the domain E is 0.3° or more, an angular deviation between a [001] direction of the domain C and a [001] direction of the domain E is 1.0° or more, and an angular deviation between a [001] direction of the domain D and a [001] direction of the domain E is 1.0° or more.

The present invention also provides a piezoelectric element including a piezoelectric member of the aforementioned construction and a pair of electrodes in contact with the piezoelectric member.

The present invention also provides a liquid discharge head including a discharge port, a liquid chamber communicating with the discharge port, a piezoelectric element disposed in correspondence with the liquid chamber, and a vibration plate disposed between the liquid chamber and the piezoelectric element, and adapted to discharge a liquid in the liquid chamber by a volume change induced by the piezoelectric element in the liquid chamber, wherein the piezoelectric element is constituted of a piezoelectric element described above.

The present invention further provides a liquid discharge apparatus including a liquid discharge head of the aforementioned construction.

It is possible, as another method of domain control called domain engineering, to obtain a piezoelectric deviation larger than the polarization deviation inherent to the material itself, based on a rotation of a domain that is not horizontal to the electric field (for example a domain having a polarization in a substantially perpendicular direction) in the polarization direction. Such rotation of the polarization direction is generally called a 90° domain switching. However, a very high energy is required for expressing such piezoelectric deviation and it is difficult to switch all the domains of [100] orientation to [001] orientation by the electric field application. In general, the phenomenon called 90° domain switching enables to switch the domains of [100] orientation to [001] orientation in a larger proportion under an application of a lower electric field, thereby obtaining a larger piezoelectric deviation.

On the other hand, in the piezoelectric member of a novel domain structure of the present invention, it is confirmed as capable of switching the domains of [100] orientation to

[100] orientation in a large proportion under an application of a practical electric field of hundreds of kV/cm (a voltage application of 100 V or less for a piezoelectric member of a thickness of several micrometers), thus obtaining a larger piezoelectric deviation. The novel domain structure of the present invention enables to provide a piezoelectric element of a larger piezoelectric property, in comparison with a case without the novel domain structure, and a piezoelectric member to be used therein. Furthermore, the piezoelectric element enables to provide a liquid discharge head having a uniform and high discharge performance and capable of a further miniaturization of the structural pattern for the discharge pressure generating element, and a liquid discharge apparatus utilizing the same.

Further features of the present invention will become apparent from the following description of exemplary embodiments with reference to the attached drawings.

BRIEF DESCRIPTION OF THE DRAWINGS

FIG. 1 is a schematic cross-sectional view illustrating an exemplary embodiment of a piezoelectric element.

FIGS. 2A and 2B are schematic views illustrating an exemplary embodiment of the piezoelectric member of the present invention.

FIGS. 12A and 12B are schematic X-ray diffraction pole figures of piezoelectric elements of Example 1 and Comparative Example 1 under application of an electric field of 200 kV/cm.

DESCRIPTION OF THE EMBODIMENTS

Construction of Piezoelectric Element

Figure 3:
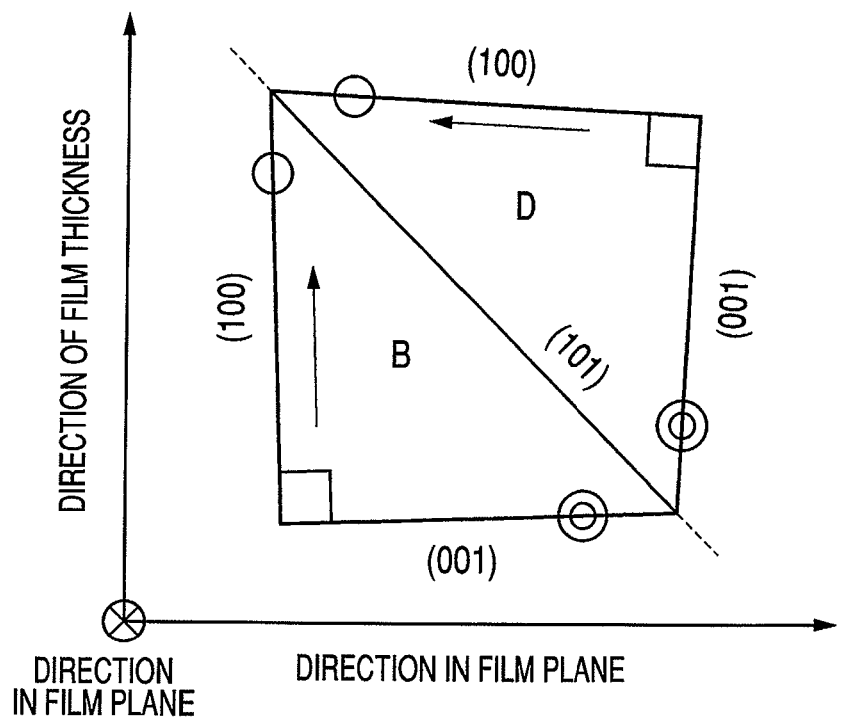
FIG. 3 is a view illustrating a domain structure of the piezoelectric member of the present invention.

In the following, the construction of the piezoelectric element of the present invention will be described. The piezoelectric element of the present invention includes a piezoelectric member of the present invention, and a pair of electrode maintained in contact with the piezoelectric member. FIG. 1 is a schematic cross-sectional view of an exemplary embodiment of the piezoelectric element of the present invention. The piezoelectric element 10 at least includes a first electrode film 6, a piezoelectric member 7 of the present invention, and a second electrode film 8. In the piezoelectric element of the embodiment illustrated in FIG. 1, the piezoelectric element 10 is illustrated to have a rectangular cross-sectional shape, but it may also have a trapezoidal shape or an inverted trapezoidal shape. The piezoelectric element 10 is formed on a substrate 5, and each of the first electrode film 6 and the second electrode film 8 constituting the piezoelectric element 10 may be constructed as either of a lower electrode and an upper electrode. This depends on the process for producing the device, and the effects of the present invention may be accomplished in either case. Also a buffer layer 9 may be disposed between the substrate 5 and the first electrode film 6. The piezoelectric element 10 can be produced by forming the first electrode film 6 at least on the substrate 5 or on the buffer layer 9 formed on the substrate 5, then forming the piezoelectric member 7 thereon, and further forming the second electrode film 8.

(Construction of Piezoelectric Member)

The piezoelectric member 7 is constituted of an epitaxial oxide of a <100> orientation having at least a tetragonal crystal structure, which is a perovskite type composite oxide represented by a general formula $ABO_3$. While the perovskite composite oxide of tetragonal crystal structure has a [001] polarization direction, the piezoelectric member of the present invention has a <100> orientation including at least a tetragonal crystal structure, considered suitable for the improvement of piezoelectric property utilizing domain engineering, that is generally called a 90° domain switching. More specifically, it is considered possible, when an electric field is applied to the piezoelectric element, to align the polarization direction of a most part of the domains constituting the piezoelectric member in the direction of film thickness.

In the present invention, the <100> orientation means having a single crystal orientation of <100> in the film thickness direction and having a single crystal orientation in the direction in film plane. Also the epitaxial film in the present invention means a film having a single crystal orientation in the direction of film thickness and in the direction in film plane, utilizing the crystallinity of the substrate or the lower-layer film (for example lower electrode film). Thus, a non-random orientation in the direction in film plane enables to obtain the complex crystal structure of the present invention. For example, SRO (strontium ruthenate) of perovskite structure and PZT have close lattice constants of about 4 Å. Therefore, by forming SRO of <100> orientation as a lower electrode film and then forming PZT or PTO as a piezoelectric member thereon, PZT or PTO of <100> orientation can be formed depending on the film forming conditions. Thus, the epitaxial film is a film having a single crystal orientation in the direction of film thickness and in the direction in film plane, utilizing the crystallinity of the substrate or the lower-layer film (for example lower electrode film). Also the epitaxial oxide of the present invention has a single crystal orientation mentioned above.

(Material for Piezoelectric Member)

The piezoelectric member in the present invention is constituted of a perovskite type composite oxide represented by a general formula $ABO_3$. The material therefor may be any one capable of constructing the piezoelectric member intended in the present invention. Examples of such material include a ferroelectric material exhibiting a ferroelectric property, a pyroelectric property and a piezoelectric property, as represented by $PbTiO_3$ (lead titanate: PTO). Also included is a relaxer type electrostriction material exhibiting an excellent piezoelectric property, as represented by $Pb(Zn_xNb_{1-x})O_3$ (lead zincate niobate: PZN). In particular, such materials may include a morphotropic phase boundary (MPB), and such MPB region is known to generally have a particularly satisfactory piezoelectric property. Examples of such material include ferroelectric materials such as lead zirconate titanate (PZT), lead zincate niobate titanate (PZN-PT), lead magnesate niobate titanate (PMN-PT) represented by following formulae, and relaxer type electrostriction materials:

PZT: $Pb(Zr_xTi_{1-x})O_3$ 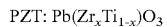

PZN-PT: $[Pb(Zn_{1/3}Nb_{2/3})O_3]_{1-x}—(PbTiO_3)_x$ 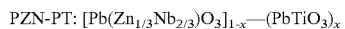

PMN-PT: $[Pb(Mg_{1/3}Nb_{2/3})O_3]_{1-x}—(PbTiO_3)_x$ 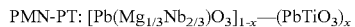

wherein, for example lead titanate is represented by $PbTiO_3$, but the composition of each element may contains a certain difference induced at the film formation. For example, even in the presence of a compositional difference such as $Pb_{1.2}TiO_{2.7}$, such difference is permissible so far as the piezoelectric member can be formed as an epitaxial film constituted of a perovskite composite oxide of general formula $ABO_3$. Also X represents a number from 1 to 0. The MPB region generally exists, for example in case of PZT, within a range of X of from 0.4 to 0.7, also in case of PZT-PT, within a range of X of from 0.05 to 0.3, and in case of PMN-PT, within a range of X of from 0.2 to 0.4. Also the piezoelectric member of the present invention may be formed by a material other than the lead-based materials mentioned above. Examples of the material other than the lead-based materials include $BaTiO_3$ (barium titanate: BTO), and $LiNbO_3$ (lithium niobate: LNO). Also included are non-lead materials that are attracting attention recently, such as $BiFeO_3$ (bismuth ferrate) and $BiCoO_3$ (bismuth cobaltate). Also employable are PMN-PZT formed by substituting Zr of PMN-PT with Ti, and a material obtained by doping the aforementioned materials with a small amount of an element such as $(Pb, La)(Zr_xTi_{1-x})O_3$ (PLZT).

The principal component of the epitaxial oxide constituting the piezoelectric member is preferably lead titanate or lead zirconate titanate. This is because, among the perovskite composite oxides represented by general formula $ABO_3$, a ferroelectric material such as PTO or PZT has a larger strain of the tetragonal crystal lattice in comparison with a relaxer electrostriction material such as PZN-PT. (The strain in the crystal lattice means a ratio c/a of the axes a and c of the crystal lattice.) Such fact facilitates generation of a large piezoelectric change utilizing a domain rotation, called 90° domain switching, and also facilitates relaxation of the internal stress generated at the preparation of the piezoelectric element. For example, PTO has a ratio c/a of the axes a and c of the crystal lattice, of about 1.06. Also PZT in the vicinity of the morphotropic phase boundary (MPB) has a ratio c/a of the axes a and c of the crystal lattice, of about 1.03. Also $BaTiO_3$ (barium titanate) has a ratio c/a of the axes a and c of the crystal lattice, of about 1.01. Also $BiCoO_3$ (bismuth cobaltate) has a ratio c/a of the axes a and c of the crystal lattice, as large as about 1.25, and is therefore an excellent piezoelectric member.

(Domain Structure)

It is generally considered that a high piezoelectric property can be obtained, in a piezoelectric member of a bulk single crystal, by applying an electric field in the direction of spontaneous polarization. On the other hand, the piezoelectric element of the present invention provides an excellent performance by utilizing a domain engineering utilizing a domain rotation, called a 90° domain switching. As the piezoelectric deviation utilizing the domain rotation generates a deviation comparable to the ratio c/a of the axes a and c of the crystal lattice, expectable theoretically is a piezoelectric deviation of 10 times or more of the domain deviation obtained by applying the electric field in the direction of spontaneous polarization. However, involved are problems that the piezoelectric deviation requires a very high energy and that the proportion of the domains contributing to the rotation is limited. In the present invention, a domain means a small crystal region present in the piezoelectric member, in which the lattice constant and the crystal orientation remain constant. The piezoelectric member of the present invention has a structural model as represented in FIGS. 2A and 2B. More specifically, it at least includes domains C, D and E of [100] orientation, having a mutual deviation in the crystal orientation. Preferably, it includes, in addition to the domains C, D and E, at least domains A and B of [001] orientation, having a mutual deviation in the crystal orientation.

The angular deviation in the crystal direction between two domains is as follows:

an angular deviation between the [100] direction of the domain C and the [100] direction of the domain D is 5° or less;

an angular deviation between the [100] direction of the domain D and the [100] direction of the domain E is 5° or less;

an angular deviation between the [100] direction of the domain C and the [100] direction of the domain E is 0.3° or less;

an angular deviation between the [100] direction of the domain D and the [100] direction of the domain E is 0.3° or more;

an angular deviation between the [001] direction of the domain C and the [001] direction of the domain E is 1.0° or more; and an angular deviation between the [001] direction of the domain D and the [001] direction of the domain E is 1.0° or more.

It is preferable also that an angular deviation between the [001] direction of the domain A and the [001] direction of the domain B is 5.0° or less.

Also the "angular deviation" in the following cases (1) to (3) does not include 0°:

(1) the angular deviation between the [100] direction of the domain C and the [100] direction of the domain D;

(2) the angular deviation between the [100] direction of the domain D and the [100] direction of the domain E; and (3) the angular deviation between the [001] direction of the domain A and the [001] direction of the domain B.

This is because the aforementioned domains have an angular deviation in the designated direction, and such angular deviation is preferably about 0.4° or larger.

In the aforementioned domains, "A" and "B" are symbols for distinguishing two different domains, and do not mean the components "A" and "B" in the general formula $ABO_3$ representing the construction of the perovskite type composite oxide.

The piezoelectric member of the present invention has such complex structure, and the relationships of each domains will be described further in the following. In the domains C, D and E of [100] orientation, and in the relation of the [100] directions approximately in the direction of film thickness, the angular deviation in the crystal direction between two domains is as follows:

the angular deviation between the [100] direction of the domain D and the [100] direction of the domain E is from 0.3° to 5°;

the angular deviation between the [100] direction of the domain C and the [100] direction of the domain D is 5° or less; and the angular deviation between the [100] direction of the domain C and the [100] direction of the domain E is from 0.3° or less.

Thus, despite of the complex structure, the <100> axis is only inclined by about 5° from the direction of film thickness, so that there is an enough perturbation in the crystal direction for realizing the domain engineering. The situation is similar, in the domains A and B of [001] orientation, in that the angular deviation between the [001] direction of the domain A and the [001] direction of the domain B, approximately in the direction in film thickness, is about 5° or less. Furthermore, in the [001] direction which is perpendicular to the [100] direction (approximately in the direction in film plane), the angular deviation in the crystal directions between two domains is as follows:

the angular deviation between the [001] direction of the domain C and the [001] direction of the domain E is 1.0° or more; and the angular deviation between the [001] direction of the domain D and the [001] direction of the domain E is 1.0° or more.

Thus the domain E has a certain in-plane rotation with respect to the domains C and D.

In a film formation on the substrate, the film is subjected to a stress from the substrate, resulting from the film forming mechanism. Such stress enables to intentionally form the 90° domain structure, but is also considered to hinder the domain rotation. A first reason for the high piezoelectric property of the piezoelectric element of the present invention is presumably because the stress of the film received from the substrate is appropriately relaxed by the angular deviations in the [100] directions of the domains C, D and E and by the domain rotation in the [001] direction. Such stress relaxation is presumed to reduce the energy, required for inducing the piezoelectric deviation utilizing 90° domain switching.

At the same time, the excellent characteristics of the piezoelectric element of the present invention are considered ascribable to the presence of a complex structure in the piezoelectric member having the crystal orientation. The aforementioned Non-patent Reference 2 reports, as a method of improving the piezoelectric property by the domain control, that a reduction in the domain size is effective. With a reduction in the domain size, the domain becomes capable of having a small fluctuation, thus reducing the energy required for the piezoelectric deviation by the domain engineering. It is considered important, in a thin film involving a film stress and many lattice defects, to control the domain in a state having such small fluctuation in order to obtain a large piezoelectric deviation by the domain engineering. Thus a second reason for the high piezoelectric property of the piezoelectric member of the present invention is presumably because a structure having such small domain size as described above can be realized in the piezoelectric member of the present invention. The complex structure in the piezoelectric member of the present invention is a structure containing plural domains having very small deviations in the crystal orientation with respect to a certain domain. The presence of such domains enables to induce a domain rotation, called 90° domain switching, in the piezoelectric member, thereby reducing the energy for the piezoelectric deviation by the domain engineering and realizing a high piezoelectric property.

In the piezoelectric member of the present invention it is preferable that the domains A, B, C, D and E are tetragonal crystals and that the lattice constant is same at least in the domains B, C, D and E. More preferable is a case where the lattice constants of the domains B, C, D and E coincide with the lattice constant of a bulk member of a same composition. When the piezoelectric member has such a structure, it is presumed that the stress, received from the substrate based on the film forming mechanism, is almost removed. It is further preferable, in the piezoelectric member of the present invention, that the domains B and D constitute a twin crystal having a mirror image relationship, that the twin crystal has a [110] twin plane, that the domains C and E constitute a twin crystal of a mirror image relationship, and that the twin crystal has a [110] twin plane. This is because, when the piezoelectric member has such structure, it is presumed that the stress, received from the substrate based on the film forming mechanism, is almost removed. Furthermore, the piezoelectric member of the present invention is preferably a film having a thickness of 0.6 μm or larger. A film thickness of 0.6 μm or larger enables to easily obtain the complex twin crystal structure of the present invention. Although dependent on the material and the type of the substrate, it is difficult, with a film thickness less than 0.6 μm, to obtain the B, D and E domains constituting the complex twin crystal structure of the present invention.

(Twin Crystal)

The presence of the twin crystal structure in the domains constituting the piezoelectric member of the present invention is presumably because of the following reason. In the piezoelectric member of the present invention, it is preferable that the lattice constant is same at least in the domains B, C, D and E, and coincides with the lattice constant of the bulk member of the same composition. This means that at least the domains B, C, D and E are in a state not subjected to a stress from the substrate, resulting from the film forming mechanism. Stated differently, the piezoelectric member of the present invention is considered to be capable of appropriately relaxing the stress by assuming the aforementioned complex structure. For such relaxation, presence of a certain deviation among the domains is necessary, and, in the piezoelectric member of the present invention, a relaxation is presumed to take place utilizing a lattice deviation induced by a twin crystal defect.

The domains constituting a twin crystal having a mirror image relationship with a [110] twin plane have following relationship. At first described is a case where the domains B and D of tetragonal crystal structure constitute a twin crystal having a mirror image relationship with a (101) twin plane. The domains B and D assume a relationship as illustrated in FIG. 3. In the relationship of the [001] direction of the domain B, approximately in the direction of film thickness, and the [100] direction of the domain D, approximately in the direction of film thickness, the deviation between these crystal directions is as follows. The [001] direction of the domain B and the [100] direction of the domain D have a deviation of approximately a magnitude defined by subtracting 90° from twice of a tangential angle of the a-axis length and c-axis length of the crystal lattice of the domains B and D.

Figure 4:
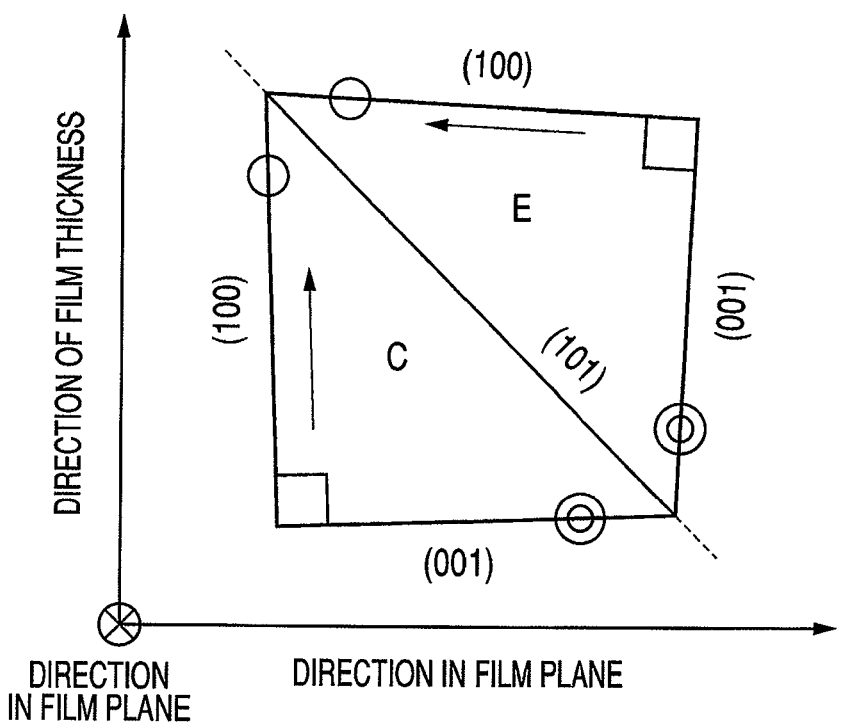
FIG. 4 is a view illustrating a domain structure of the piezoelectric member of the present invention.

Now there will be described a case where the domains C and E of tetragonal crystal structure constitute a twin crystal having a mirror image relationship, with a (101) twin plane. The domains C and E assume a relationship as illustrated in FIG. 4. In the relationship of the [001] direction of the domain C, approximately in the direction in film plane, and the [100] direction of the domain E, approximately in the direction in film plane, the deviation between these crystal directions is as follows. The [001] direction of the domain C and the [100] direction of the domain E have a deviation of approximately a magnitude defined by subtracting 90° from twice of a tangential angle of the a-axis length and c-axis length of the crystal lattice of the domains C and E. In FIGS. 3 and 4, arrows indicate the direction of [001] axis.

In a perovskite composite oxide represented by the general formula $ABO_3$, particularly in a lead-based perovskite composite oxide, the ratio of the a-axis length and the c-axis length of the tetragonal crystal is generally small. Among the known materials, the ratio of the a-axis length and the c-axis length is relatively large in PTO, in which the ratio c/a of the a-axis and c-axis of tetragonal crystal is about 1.06. The aforementioned deviation, determined from this value, is about 3.5°. On the other hand, in consideration also of non-lead type piezoelectric materials, for example $BiCoO_3$ (bismuth cobaltate) has the ratio c/a of the a-axis and c-axis of tetragonal crystal as large as about 1.25. Therefore, the deviation is anticipated to exceed 10°. Also the twin crystal structures of mirror image relationship in the domains B and D, and in the domains C and E are estimated to facilitate satisfying the following relationships:

the angular deviation between the [100] direction of the domain D and the [100] direction of the domain E is 0.3° or less; and the angular deviation between the [001] direction of the domain D and the [001] direction of the domain E is 1.0° or more.

As the following points (a) and (b) result from the aforementioned mirror image relationship of twin crystal, the upper limit of the angular deviation is preferably 5° or less in case of PTO, and, even in case of $BiCoO_3$ anticipated to have the largest deviation, is preferably 15° or less and more preferably 5° or less:

(a) the angular deviation between the [001] direction of the domain C and the [001] direction of the domain E is 1.0° or more; and (b) the angular deviation between the [001] direction of the domain D and the [001] direction of the domain E is 1.0° or more.

(Volume Proportion)

Within all the domains A, B, C, D and E of the present invention, the proportion of the domains A and B is determined by a thermal expansion coefficient $\alpha_{sub}$ of the substrate, a thermal expansion coefficient $\alpha_{film}$ of the epitaxial oxide film, a film forming temperature Ts, and a Curie temperature Tc of the epitaxial oxide film. Also by assuming a relation $\sigma=(Ts-Tc)\times(\alpha_{film}-\alpha_{sub})$ Vc is represented by a first-order function of $\sigma$. It can therefore be understood that Vc can be controlled by a thermal stress which the epitaxial oxide film receives from the substrate.

<Confirmation Method for Crystal Orientation>

Figure 5:
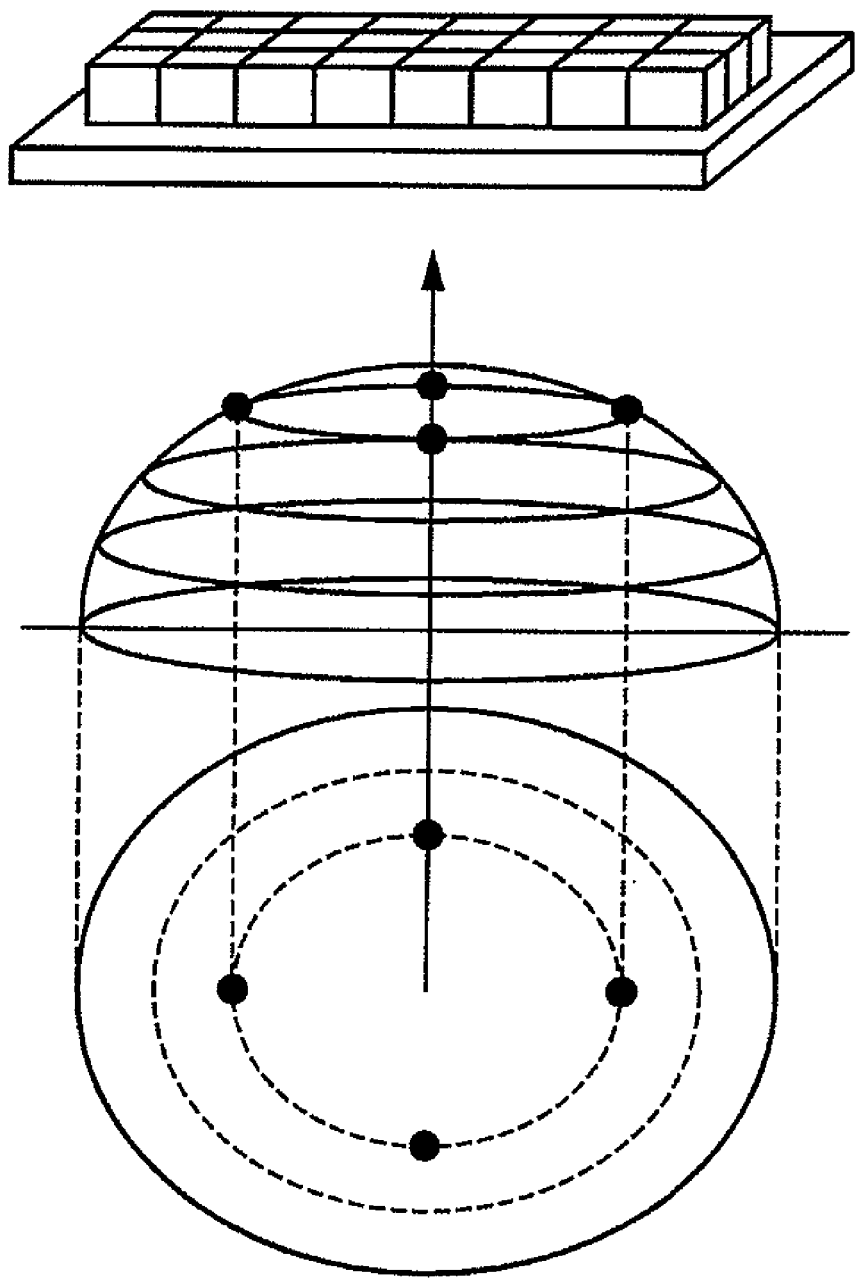
FIG. 5 is a schematic view of the piezoelectric member of the present invention and a schematic X-ray diffraction pole figure thereof.

The <100> orientation in the present invention can be easily specified by an X-ray diffractometry. For example, in case of PZT of tetragonal <100> orientation, the peaks of the piezoelectric member detected in the 2θ/θ measurement in X-ray diffractometry are only those of [L00] planes (L=1, 2, 3, ..., n; n being an integer) such as [100] and [200]. Also in a polar measurement of [110] asymmetrical plane, the polar points of the [110] asymmetrical plane of each crystal are measured as 4-times symmetric spot-like patterns at every 90° on a circle, corresponding to an inclination of about 45° from the film thickness direction of the piezoelectric member, as indicated by an arrow in FIG. 5. The "film thickness direction" in this case is a direction of a normal line to the [L00] plane of the crystal of the piezoelectric member.

(Definition of Crystal Orientation)

In the description, the expression <100> is a collective presentation of 6 directions generally represented by [100], [010], [001] etc. For example, [100] and [001] have the same meaning in case of a cubic crystal system, but have to be distinguished in case of a tetragonal or rhombic crystal system. However, the crystal of perovskite composite oxide has, even in case of a tetragonal or rhombic crystal, a lattice constant close to that of the cubic crystal. In the present invention, therefore, [100] and [001] of tetragonal crystal, [111] of rhombic crystal and [$\bar{1}$ $\bar{1}$ $\bar{1}$] are collectively represented by <100> or <111>. In the following, $\bar{1}$ is represented as "1 bar".

In the present invention, for example in PZT of tetragonal crystal, even if [001] which is a polarization direction and [001] or [010] which is a non-polarization direction are present at the same time, it is a <100> orientation having a single <100> crystal direction. The piezoelectric member of the present invention also includes a case where plural crystal phases such as a rhombic crystal and a monoclinic crystal are mixed in addition to the tetragonal crystal, a case where crystals resulting from a twin crystal or the like are mixed, and a case including a dislocation or a defect, and these cases are also regarded as a <100> orientation in a wide sense. This is because, even in the case that such phases or twin crystals are mixed, the <100> axis is only inclined by about 5° from the direction of film thickness and is thus enough for realizing the domain engineering. Thus, the <100> orientation in the present invention indicates that the piezoelectric member has a single <100> crystal direction in the direction of film thickness, but a member having an inclination within a range of several degrees, for example a case where the <100> crystal axis is inclined by about 5° from the direction of film thickness, is also called a <100> orientation. Also in the present invention, the expression {110} is a collective presentation of 6 planes generally represented by (110), (101), (011) etc., and the details thereof are similar to the aforementioned presentation on the direction.

(Method for Confirming Crystal Phase)

The crystal phase of the piezoelectric member can be determined by specifying lattice constants by an inverse lattice space mapping in the X-ray diffractometry. For example in the piezoelectric member of PZT of <100> orientation, following methods can be utilized:

(1) In case of a domain B of a tetragonal crystal having the [001] direction approximately in the direction of film thickness, the c-axis length of the unit lattice of such domain can be determined from a distance (scalar component) between a (004) inverse lattice point of the domain obtained by the inverse lattice space mapping and a (000) inverse lattice point which is the original point;

(2) The a-axis length of the unit lattice of the domain can be determined from a distance between a (004) inverse lattice point of the domain and a (204) inverse lattice point;

(3) The angle α of the unit lattice of the domain can be determined from a direction (vector component) between a (004) inverse lattice point of the domain and a (000) inverse lattice point which is the original point, and from a direction between a (004) inverse lattice point of the domain and a (204) inverse lattice point, as an internal angle between a-axis and c-axis. The crystal system and the lattice constants of the domain B can be easily specified by such measurements.

(Method for Confirming Domain)

For confirming the domains in the present invention, a measurement with a high angular resolution is required. Therefore, for distinguishing each domain in the present invention, an X-ray diffractometry is employed preferably. As the apparatus for X-ray diffractometry, it is preferable to utilize an X-ray diffraction apparatus having a multi-axis goniometer, and to insert a solar slit of 0.01 Radian or less in the vertical and horizontal dispersions, in front of the detector for the diffracted X-ray. Examples of the advantageously usable X-ray diffraction apparatus having a multi-axis goniometer include X'Pert MRD (trade name) manufactured by Panalytical Co. and ATX-E (trade name) manufactured by Rigaku Co. Also in a multi-axis goniometer, the scanning precision of the scanning rotation angle (generally about the φ-axis) for polar measurement is often inferior to the scanning precision (generally about the 2θ-axis) in the 2θ/θ measurement. Therefore, in case of a polar measurement within a range of several degrees as in the present invention, a polar measurement with a high angular resolution can be realized by an overhead angle scanning (generally about ω-axis and ψ-axis). The confirmation can also be executed for example by a cross-sectional observation under a transmission electron microscope (TEM), in place for the X-ray diffractometry described above.

Figure 6A:
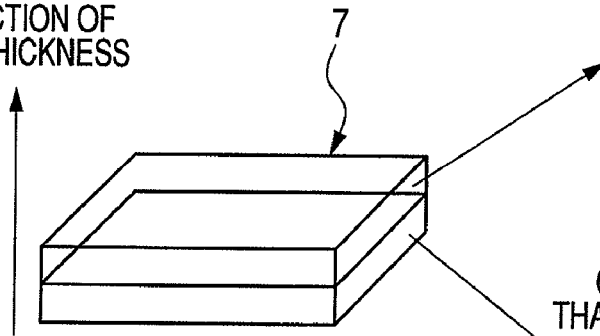
FIGS. 6A and 6B are views illustrating an exemplary embodiment of the piezoelectric member of the present invention.
Figure 6B:
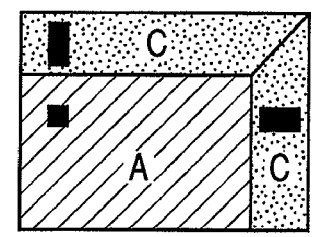
Figure 6B:
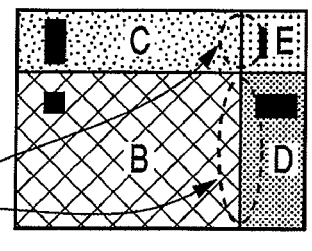
Figure 7:
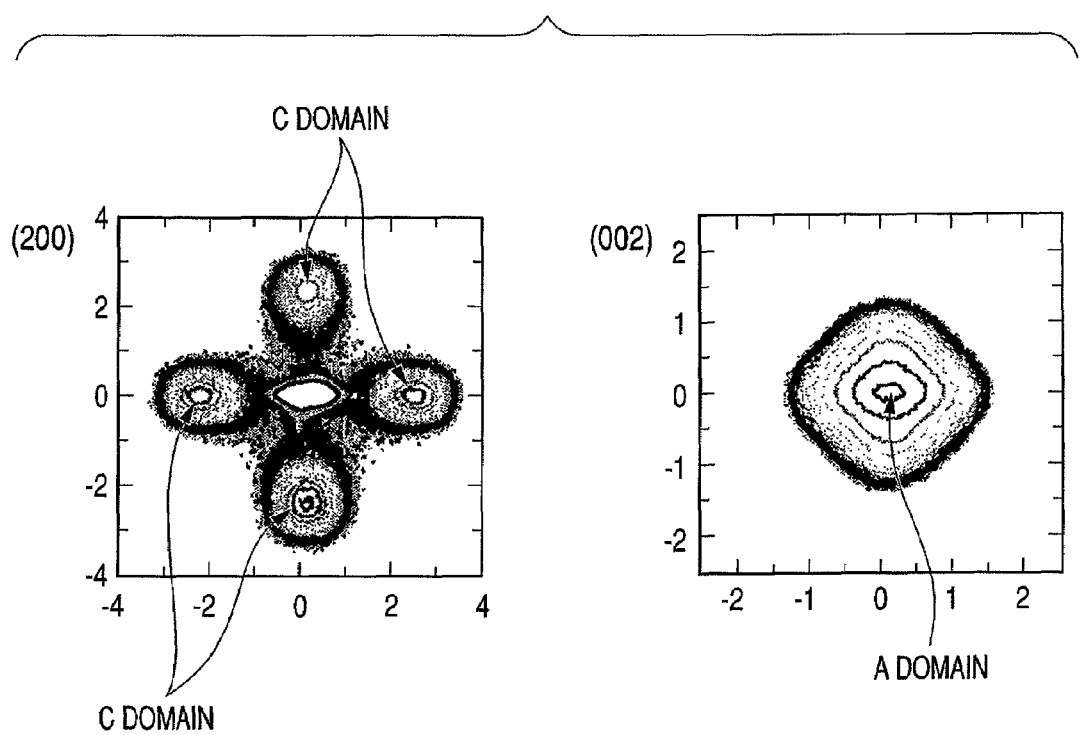
FIG. 7 is a schematic X-ray diffraction pole figure of the piezoelectric member of the present invention.
Figure 8:
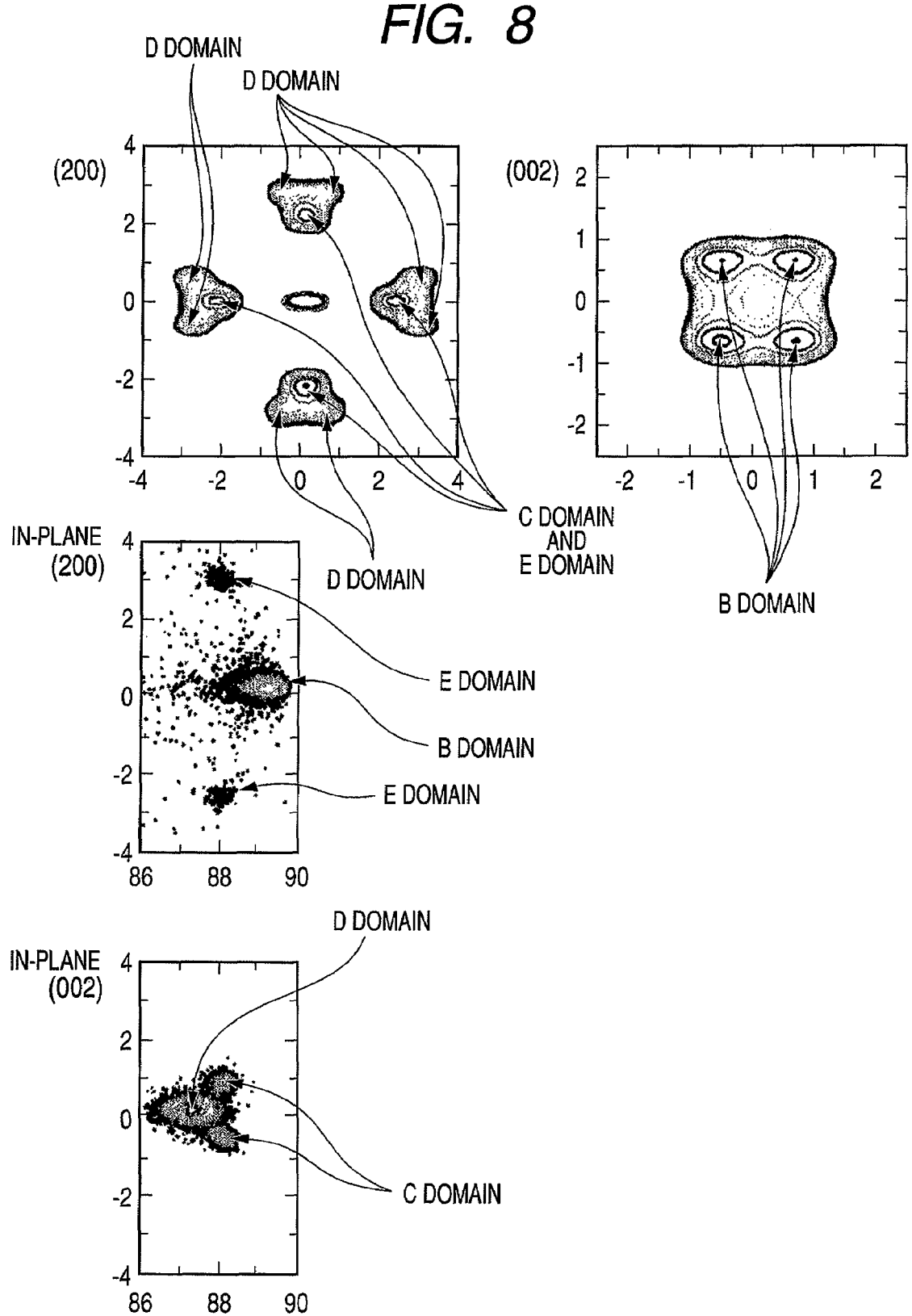
FIG. 8 is a schematic X-ray diffraction pole figure of the piezoelectric member of the present invention.

Now described is a method for confirming the domain, when the piezoelectric member of the present invention assumes a structure as illustrated in FIGS. 6A and 6B. FIGS. 7 and 8 illustrate examples of the result of X-ray diffraction when the piezoelectric member of the present invention satisfies following conditions. FIGS. 7 and 8 illustrate results of polar measurement within an inclination range of about 5° from the film thickness direction of the piezoelectric member, respectively for the piezoelectric members of film thicknesses of 0.5 μm and 2.0 μm, in which:

(1) the piezoelectric member is constituted of PTO of an epitaxial film of <100> orientation;

(2) it includes domains A, B, C, D and E of tetragonal crystal structure, among which the domains A and B have a [001] orientation and the domains C, D and E have a orientation;

(3) the domains B, C, D and E have a same lattice constant;

(4) the domains B and D at least have a mirror image relationship of a twin crystal;

(5) the twin crystal has a (101) twin plane;

(6) the domains C and E at least have a mirror image relationship of a twin crystal; and (7) the twin crystal has a (101) twin plane.

In the structure illustrated in FIGS. 6A and 6B, the domain B in PTO of the film thickness of 2.0 μm provides a diffraction angle at about 43.5° in the 2θ X-ray diffraction (with Kα-ray of Cu used as the X-ray source). Thus a polar measurement within a range of inclination of 5° from the film thickness direction of the piezoelectric member, with 2θ fixed at the diffraction angle at about 43.5°, provides diffraction points as illustrated in a polar figure (002) in FIG. 8. In the polar figures as illustrated in FIGS. 7 and 8, the domain may have plural diffraction points. This results from a fact that the piezoelectric member of the present invention has a 4-times symmetry in the direction in film plane.

Also in the case that the domain has a large half-peak width (fluctuation in the crystal direction) or in the case that the deviation between the crystal directions of the domains A and B is very small, the diffraction points of the domains A and B may overlap with each other (because the result of X-ray diffraction on the piezoelectric member of thickness of 2.0 μm also contains information of the domains present in the piezoelectric member of thickness of 0.6 μm or less). Even in case of such overlapping of the diffraction points, these may be distinguished as respective domains, so far as the peak tops of the respective diffraction points can be confirmed (so far as the peaks can be separated).

Also the in-plane (200) or in-plane (002) polar measurement means a result of polar measurement within a range of inclination of 5° from the direction in film plane of the piezoelectric member, with 2θ in X-ray diffractometry fixed at the diffraction angle of the corresponding domain. For example in the X-ray diffraction apparatus X'Pert MRD (trade name) manufactured by Panalytical Co., such measurement can be executed in a similar manner as the (200) or (002) polar measurement, in a state where the ψ-axis is inclined by 90°.

(Method for Confirming Twin Crystal)

Figure 9:
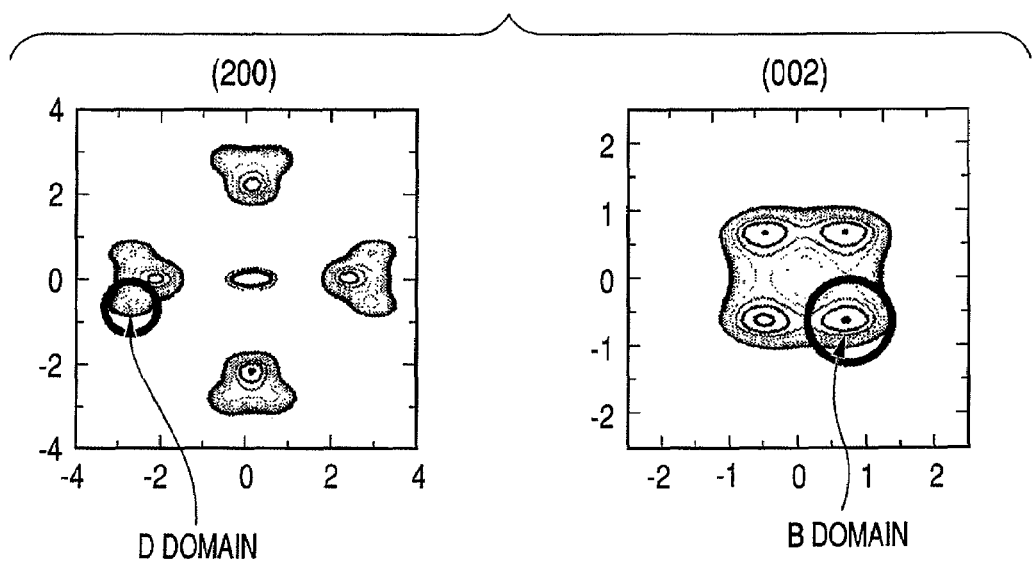
FIG. 9 is a schematic X-ray diffraction pole figure of the piezoelectric member of the present invention.

The twin crystal in the piezoelectric member can be easily specified by a polar measurement in X-ray diffraction. For example in the PTO piezoelectric member of the structure illustrated in FIGS. 6A and 6B, when the domains B and D have a mirror image relationship of a twin crystal, the deviation between the [001] direction of the domain B and the [100] direction of the domain D is as described before. More specifically, the magnitude of deviation is approximately given by subtracting 90° from twice of a tangential angle of the a-axis length and c-axis length of the crystal lattice of the domains B and D. In FIG. 9 illustrating an excerpt of the (200) and (002) polar figures in FIG. 8, and in the domains B and D indicated by black circles, the [001] direction of the domain B and the [100] direction of the domain D are about 3.6°. PTO in a bulk state has lattice constants of a=3.90 and c=4.15, and the magnitude obtained by subtracting 90° from twice of a tangential angle of the a-axis length and c-axis length is about 3.6°. It can therefore be identified that the domains B and D, indicated by black circles, have a mirror image relationship of a twin crystal having a (101) twin plane.

Figure 10:
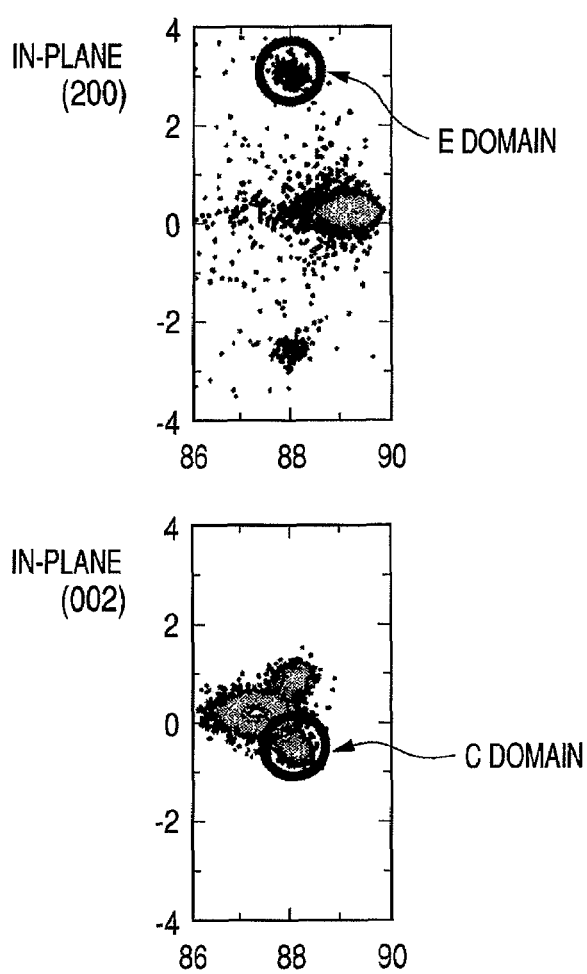
FIG. 10 is a schematic X-ray diffraction pole figure of the piezoelectric member of the present invention.

Similarly, in the PTO piezoelectric member of the structure illustrated in FIGS. 6A and 6B, when the domains C and E have a mirror image relationship of a twin crystal, the deviation between the [001] direction of the domain C and the [100] direction of the domain E is as described before. More specifically, the magnitude of deviation is approximately given by subtracting 90° from twice of a tangential angle of the a-axis length and c-axis length of the crystal lattice of the domains C and E. In FIG. 10 illustrating an excerpt of the in-plane (200) and in-plane (002) polar figures in FIG. 8, and in the domains C and E indicated by black circles, the [001] direction of the domain C and the [100] direction of the domain E are about 3.6°. PTO in a bulk state has lattice constants of a=3.90 and c=4.15, and the magnitude obtained by subtracting 90° from twice of a tangential angle of the a-axis length and c-axis length is about 3.6°. It can therefore be identified that the domains C and E, indicated by black circles, have a mirror image relationship of a twin crystal having a (101) twin plane.

(Method for Forming Piezoelectric Member)

The epitaxial oxide utilizable as the piezoelectric member of the present invention is not particularly restricted in the method of forming a film. A thin film of 10 μm or less can be formed by a thin film forming method such as a sol-gel method, a hydrothermal synthesis, a gas deposition or an electrophoretic method. Also usable are other thin film forming methods, such as a sputtering method, a chemical vapor deposition (CVD), a metal organic chemical vapor deposition (MOCVD), an ion beam deposition, a molecular beam epitaxy or a laser ablation. These thin film forming methods enable formation of a piezoelectric member, utilizing an epitaxial growth from a substrate or a lower electrode. Among these film forming methods, the film formation is particularly preferably executed by a pulsed MOCVD method utilizing an apparatus illustrated in FIG. 11.

In the pulsed MOCVD method, a temperature control is preferably executed on a starting material supply path, in order that an oxidation reaction, inhibiting the single crystal film formation, does not proceed in the piping. Also in the pulsed MOCVD method, it is preferable to intermittently supply an inert carrier gas and a gaseous mixture of starting materials. A control on the intermittent cycle of the gaseous mixture enables to provide a sufficient reaction time for the gas mixture on the substrate, thereby suppressing damages to the film. As a result, there can be suppressed defects in the piezoelectric member, resulting from an oxygen deficiency, a lead deficiency and a lattice site defect of the elements constituting the crystal lattice. Particularly in order to facilitate obtaining the crystal structure of the present invention, the oxygen partial pressure is preferably made higher in order to obtain the oxide film without defects. More specifically, the flow rates of the gaseous mixture of starting materials and the inert carrier gas, and oxygen are approximately same. It is also important to exactly control the temperature in the transport line for the gaseous mixture of starting materials from the bottles of the raw materials.

Examples of the raw material employable in the MOCVD method include an alkyl metal compound, an alkoxyl metal compound, a β-diketone compound, a cyclopentadienyl compound, a halogen compound and an organic acid compound.

In case of forming a PZT film as the piezoelectric member, following substances are advantageously utilized as the raw materials (in which a group $\{(CH_3)_3CCO\}_2CH$ is represented by "thd").

Examples of the raw material for Pb include $Pb(C_2H_5)_4$, $Pb(thd)_2$, $Pb(thd)(OC_2H_5)_2$, $(C_2H_5)_3PbOCH_2C(CH_3)_3$, $Pb(C_2H_5)_3(OC_4H_9\text{-}t)$, $Pb(C_6H_5)_4$ and $PbCl_2$. Examples of the raw material for Zr include $Zr(OC_4H_9\text{-}t)_4$, $Zr(i\text{-}C_3H_7)_4$, $Zr(OC_2H_5)_4$, $Zr(OCH_3)_4$, and $Zr(OC_5H_{11}\text{-}n)_4$. Examples of the raw material for Ti include $Ti(OC_3H_7\text{-}i)_4$, $Ti(thd)_2(OC_3H_7\text{-}i)_2$, $Ti(OC_2H_5)_4$, $TiCl_4$, $Ti(OCH_3)_4$, and $Ti(OC_5H_{11})_4$. Also a part of Pb in PZT may be replaced by La etc., and in such case, $La(thd)_3$, $La(C_2H_3O_2)_4$ or $LaCl_3$ may be used as the raw material. In the composition of PZT, Pb may be present in excess for the B-site element such as Zr or Ti.

The carrier gas is selected from an inert gas, preferably Ar, $N_2$ or He. Also a gaseous mixture thereof may be used. The flow rate of the carrier gas is preferably within a range of from 10 to 1000 $cm^3$/minute.

(Electrode Film)

In the piezoelectric element of the present invention, the first electrode (electrode film) or the second electrode (electrode film) is preferably constituted of a material having a satisfactory adhesion to the piezoelectric member and a high electroconductivity. More specifically, it is preferably formed by a material capable of realizing a specific resistivity of from $10^{-7}$ to $10^{-2}$ Ω·cm in the upper electrode film or in the lower electrode film. Such material is generally a metal, and Au, Ag, Cu or a Pt-group metal such as Ru, Eh, Pd, Os, Ir or Pt is preferably employed as the material for the electrode. Also an alloy material such as a silver paste or a solder, containing the aforementioned material, has a high conductivity and can be utilized advantageously. Also a conductive oxide material such as IrO (iridium oxide), SRO (strontium ruthenate), ITO (conductive tin oxide) or BPO (barium plumbate) is advantageous as the electrode material. Also the electrode film may have a one-layered structure or a multi-layered structure. For example, a construction such as Pt/Ti may be employed for improving the adhesion with the substrate, or a construction such as SRO/LNO (lanthanum nickelate) for epitaxial growth from the substrate or from the buffer layer.

As the piezoelectric member of the present invention is preferably formed by an epitaxial oxide film, it is also preferable that at least the first electrode is formed by a single crystal or an epitaxial film. As the piezoelectric member of the present invention is formed by a perovskite composite oxide having the general formula $ABO_3$, it has a lattice constant of about 4 Å. Therefore, the material for the electrode is preferably capable of realizing a lattice constant of about 4 Å. Among the aforementioned materials, a Pt-group metal, SRO and BPO are particularly preferable. Also in the case that the first electrode film includes at least an oxide electrode film of perovskite type structure having <100> orientation, a piezoelectric member of a an epitaxial oxide having <100> orientation can be formed easily. In particular, SRO, having a lattice constant of about 4 Å, and being easy in single crystal formation in the film, can produce the epitaxial piezoelectric member more easily.

The electrode film preferably has a film thickness of from about 100 to 1000 nm, more preferably 500 nm or less. A film thickness of the electrode film equal to or larger than 100 nm can sufficiently lower the resistance of the electrode film, and a thickness equal to or less than 1000 nm can avoid the possibility of inhibiting the piezoelectric property of the piezoelectric element.

The electrode film is not particularly restricted in the forming method, and the electrode film of 1000 nm or less is produced by a thin film forming method such as a sol-gel method, a hydrothermal synthesis, a gas deposition or an electrophoretic method. Also usable are other thin film forming methods, such as a sputtering method, a chemical vapor deposition (CVD), a metalorganic chemical vapor deposition (MOCVD), an ion beam deposition, a molecular beam epitaxy or a laser ablation. These thin film forming methods enable formation of a piezoelectric member, utilizing an epitaxial growth from a substrate or a buffer layer, thus facilitating formation of the epitaxial piezoelectric member.

(Liquid Discharge Head and Liquid Discharge Apparatus)

In the following, the liquid discharge head of the present invention will be described. The liquid discharge head of the present invention includes a discharge port, an individual liquid chamber communicating with the discharge port, a vibrating plate constituting a part of the individual liquid chamber, and a piezoelectric element disposed corresponding to and at the exterior of the individual liquid chamber, for providing the vibrating plate with a vibration. In such liquid discharge head, the liquid in the individual liquid chamber is discharged from the discharge port, by a volume change induced by the vibrating plate in the individual liquid chamber. The liquid discharge head is characterized in utilizing, as the piezoelectric element, the piezoelectric element utilizing the epitaxial oxide of the aforementioned construction.

Use of the piezoelectric element, including the epitaxial oxide of the aforementioned construction of the present invention, enables to easily obtain a liquid discharge head having a high and uniform discharge performance and enabling miniaturization of the structural pattern of the discharge pressure generating element including the piezoelectric element. The liquid discharge head of the present invention is applicable to an image forming apparatus such as an ink jet printer, a facsimile apparatus, a composite equipment or a copying apparatus, or to an industrial discharge apparatus for discharging liquids other than the ink.

Figure 13:
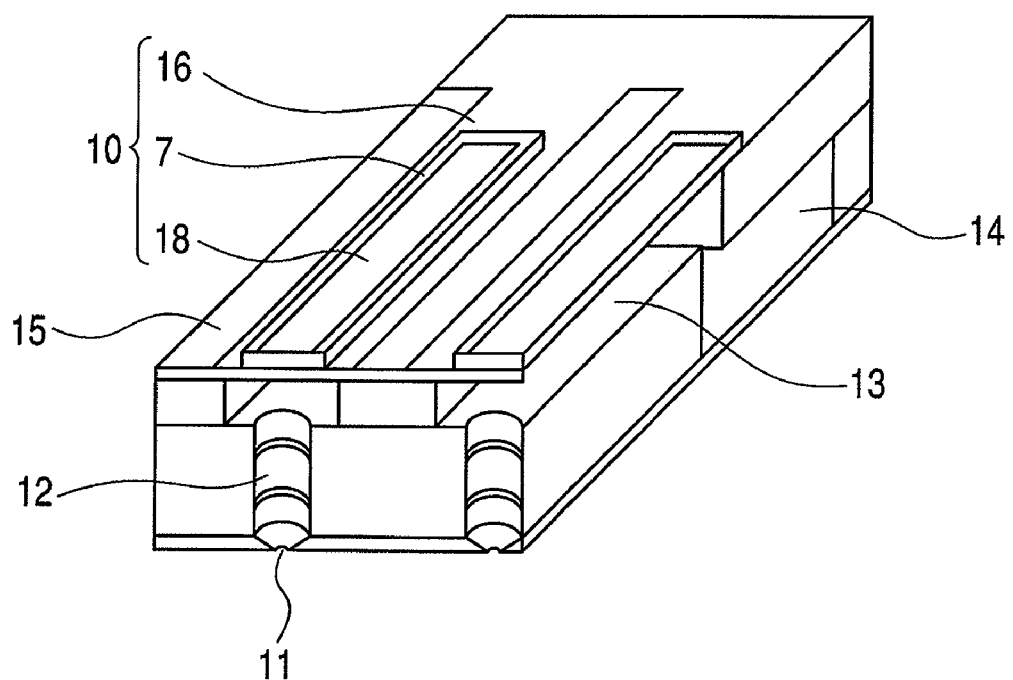
FIG. 13 is a schematic perspective view of a part of the construction of a liquid discharge head.

Now the liquid discharge head of the present invention will be described with reference to FIG. 13. FIG. 13 is a schematic view illustrating an exemplary embodiment of the liquid discharge head of the present invention. The liquid discharge head of the embodiment illustrated in FIG. 13 is equipped with a discharge port 11, a communicating hole 12 for communication between the discharge port 11 and an individual liquid chamber 13, and a common liquid chamber 14 for supplying the individual liquid chamber 13 with a liquid, and the liquid is supplied to the discharge port 11 through the communicating path. A part of the individual liquid chamber 13 is formed by a vibrating plate 15. A piezoelectric element 10 for providing the vibrating plate 15 with a vibration is disposed at the exterior of the individual liquid chamber 13. When the piezoelectric element 10 is driven, the vibrating plate 15 is given a vibration by the piezoelectric element 10 to induce a volume change in the individual liquid chamber 13, whereby the liquid in the individual liquid chamber 13 is discharged from the discharge port. The piezoelectric element 10 has a rectangular shape in an exemplary embodiment to be described later with FIG. 14, but it may also have other shapes such as an oval shape, a circular shape or a parallelogram shape.

Figure 14:
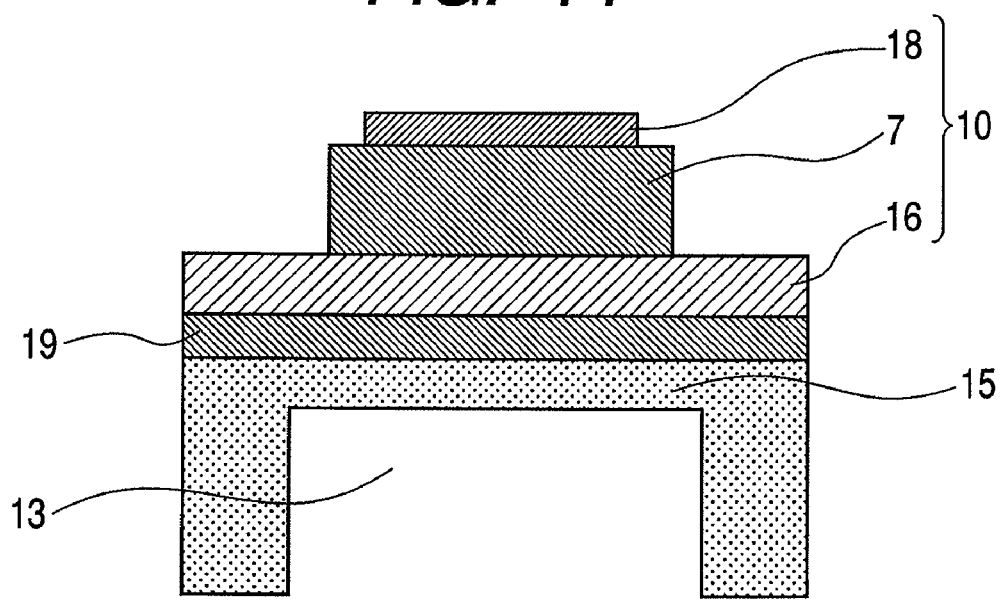
FIG. 14 is a schematic cross-sectional view of the liquid discharge head illustrated in FIG. 13, in a width direction thereof.

FIG. 14 is a schematic cross-sectional view of the liquid discharge head illustrated in FIG. 13, along a width direction thereof. Now reference is made to FIG. 14 for further describing the piezoelectric element 10 constituting the liquid discharge head of the present invention. The piezoelectric element 10 is illustrated to have a rectangular cross-sectional shape, but it may also have a trapezoidal shape or an inverted trapezoidal shape. In FIG. 14, the first electrode film 6 corresponds to the lower electrode film 16 and the second electrode film 8 corresponds to the upper electrode film 18, but each of the first electrode film 6 and the second electrode film 8 constituting the piezoelectric element 10 of the present invention may be constructed as either of the lower electrode film 16 and the upper electrode film 18. This depends on the process for producing the device, and the effects of the present invention may be accomplished in either case. Also the vibrating plate 15 may be formed by the substrate 5 constituting the piezoelectric element 10 of the present invention. Also a buffer layer 19 may be disposed between the vibrating plate 15 and the lower electrode film 16.

Figure 15:
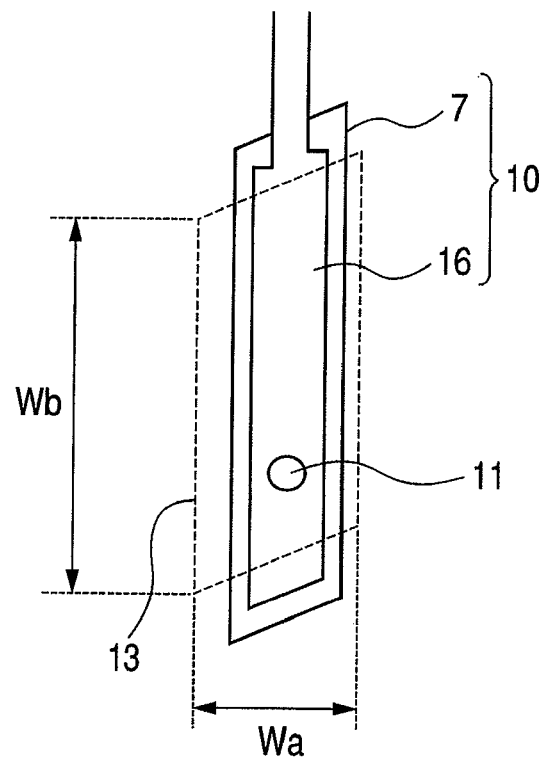
FIG. 15 is a schematic view of the liquid discharge head illustrated in FIG. 13, seen from an upper surface side (discharge port side).
Figure 16:
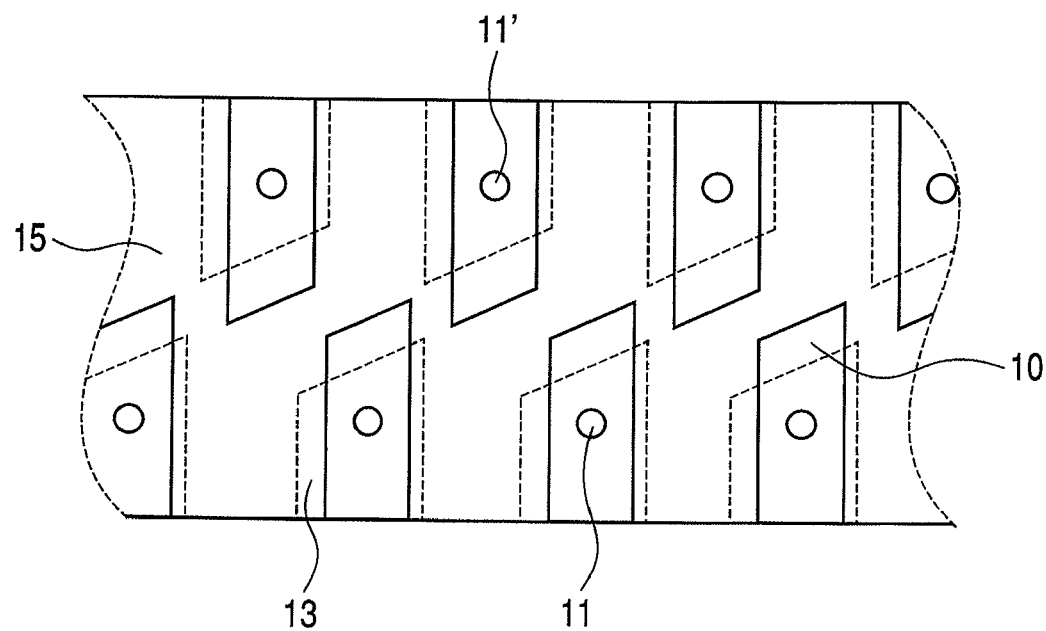
FIG. 16 is a schematic view of the liquid discharge head illustrated in FIG. 13, seen from an upper surface side (discharge port side).

FIGS. 15 and 16 are schematic views of the liquid discharge head in FIG. 13, seen from an upper surface side (side of discharge port 11). A broken-line area 13 indicates the individual liquid chamber 13 to which a pressure is applied. On the individual liquid chamber 13, the piezoelectric element 10 is formed by a suitable patterning. For example, in FIG. 15, the lower electrode film 16 is extended to a portion where the piezoelectric member 7 is absent, and the upper electrode film 18 (not shown) is extended to a side opposite to that of the lower electrode film 16 and is connected to a driving source. In FIGS. 15 and 16, the lower electrode film 16 is illustrated in a patterned state, but it may be extended to a portion where the piezoelectric member 7 is absent, as illustrated in FIG. 14. The piezoelectric member 7, the lower electrode film 16 and the upper electrode film 18 may be optimally patterned for the purpose of driving the piezoelectric element 10, so far as a trouble such as a shortcircuit or a breakage does not occur between a driving circuit and the piezoelectric element 10. The individual liquid chamber 13 is illustrated in a parallelogram shape, since the individual liquid chamber assumes such form in the case of preparation utilizing a Si(110) substrate as the substrate and utilizing an alkaline wet etching. The shape of the individual liquid chamber 13 may also be rectangular or square. In general, the individual liquid chamber 13 is formed in plural units with a predetermined pitch on the vibrating plate 15, but it is also possible to form the individual liquid chambers 13 in a staggered arrangement as illustrated in FIG. 16, or to form only one individual liquid chamber according to the purpose.

The vibrating plate 15 normally has a thickness of from 0.5 to 10 µm, preferably from 1.0 to 6.0 µm. This thickness includes the thickness of the buffer layer 19, when it is present. Also plural layers other than the buffer layer may also be formed. For example, in the case of forming the vibrating plate and the individual liquid chamber from a same substrate, a necessary etch-stop layer may also be included. The individual liquid chamber 13 normally has a width Wa (cf. FIG. 15) of from 30 to 180 µm. A length Wb (cf. FIG. 15) is normally from 0.3 to 6.0 µm, though dependent on the amount of the discharge liquid droplet. The discharge port 11 normally has a circular or star-like shape, preferably with a diameter of from 7 to 30 µm. The discharge port 11 has a cross-section preferably of a tapered shape, enlarged toward the communicating hole 12. The communicating hole 12 preferably has a length of from 0.05 to 0.5 mm. A length of the communicating hole 12 equal to or smaller than 0.5 mm provides a sufficiently discharge speed for the liquid droplet. Also a length equal to or larger than 0.05 mm reduces the fluctuation in the discharge speed of the liquid droplet from the discharge port and is therefore preferable. Also the members forming the vibrating plate, the individual liquid chamber, the common liquid chamber, the communicating hole etc. constituting the liquid discharge head of the present invention may be of a same material, or of respectively different materials. For example a material such as Si can be worked precisely by a lithographic process and an etching process. Also in the case of utilizing different materials, preferred are those providing a different in the thermal expansion coefficient of from $1 \times 10^{-8}$ to $1 \times 10^{-6}/°$ C. among the components. For example a SUS substrate or a Ni substrate is preferably selected for a Si substrate.

The piezoelectric member of the present invention can be obtained as an epitaxial film of <100> orientation including at least a tetragonal crystal. In the piezoelectric member, the crystal direction in the direction in film plane preferably has a <100> direction in the longitudinal direction of the piezoelectric element. The longitudinal direction corresponds to the direction Wb in FIG. 15.

In the following, a producing method for the liquid discharge head of the present invention will be described. The producing method for the liquid discharge head of the present invention at least includes:

(1) forming a discharge port;
(2) forming a communicating hole for communication between the discharge port and the individual liquid chamber;
(3) forming an individual liquid chamber;
(4) forming a common liquid chamber communicating with the individual liquid chamber;
(5) forming a vibrating plate for providing the individual liquid chamber with a vibration; and
(6) forming a piezoelectric element of the present invention at the outside of the individual liquid chamber, for providing the vibrating plate with a vibration.

More specifically, a first method for producing the liquid discharge head of the present invention is the following method. At first, on a substrate on which the piezoelectric element 10 is formed by (6) above, a part of the individual liquid chamber and a vibrating plate are formed by (3) above. Separately, a substrate bearing a communicating hole and a individual liquid chamber by (2) and (4) above and a substrate bearing a discharge port by (1) above, are prepared. Then the above-mentioned substrate and these substrates are laminated and integrated to obtain a liquid discharge head.

Also a second method for producing the liquid discharge head of the present invention is the following method. At first, a substrate on which an individual liquid chamber is to be formed or a substrate on which an individual liquid chamber is formed is prepared at least by (3) above. Then, the piezoelectric element, or the vibrating plate and the piezoelectric element, are transferred from a substrate bearing a piezoelectric element by (6) above or from a substrate bearing a vibrating plate and a piezoelectric element by (5) and (6) above. Then, in the substrate on which the piezoelectric element or the vibrating plate and the piezoelectric element are transferred, at least a portion at a side opposed to the piezoelectric element etc. is worked as in (2) above to form an individual liquid chamber. Then, as in the aforementioned first method, a substrate bearing a communicating hole and a common liquid chamber and a substrate bearing a discharge port are prepared, and these substrates are laminated and integrated to obtain a liquid discharge head.

Figure 17:
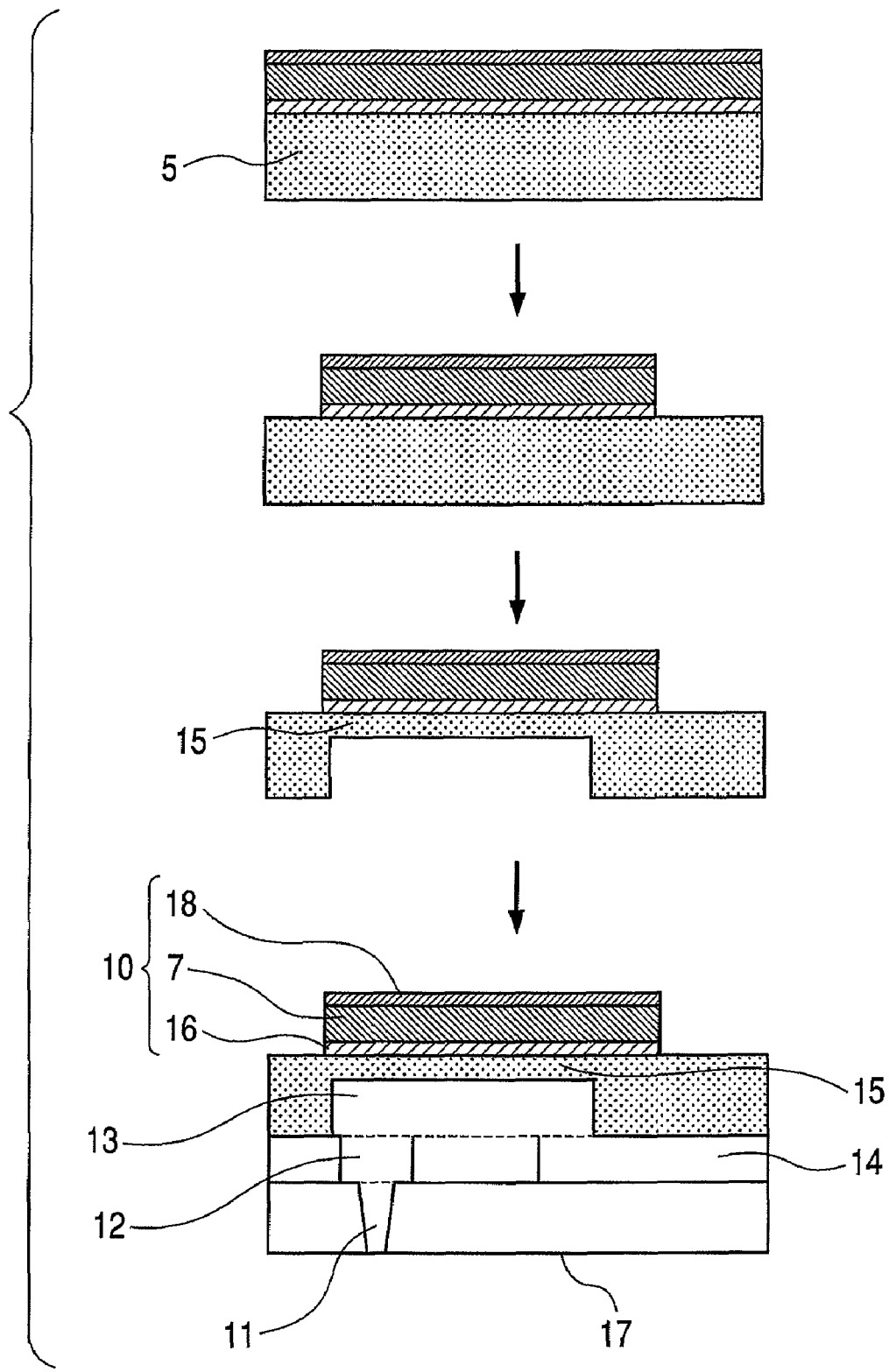
FIG. 17 is a schematic view illustrating an example of a producing process for the liquid discharge head of the present invention.

As the first method, as illustrated in FIG. 17, a piezoelectric element 10 is formed on a substrate 5 as in the producing method for the piezoelectric element. Then, in a state in which at least the piezoelectric element 10 is patterned, a part of the substrate 5 is removed to form a part of the individual liquid chamber 13 and to form a vibrating plate 15. Separately, a substrate bearing a common liquid chamber 14 and a communicating hole 12 is prepared, and a substrate bearing a discharge port 11 is prepared. Then these are integrated by laminating to obtain a liquid discharge head. Examples of the method for removing a part of the substrate 5 include a wet etching, a dry etching and a sand blasting. The vibrating plate 15 and at least a part of the individual liquid chamber 13 can be formed by removing a part of the substrate 5 by such method.

Figure 18:
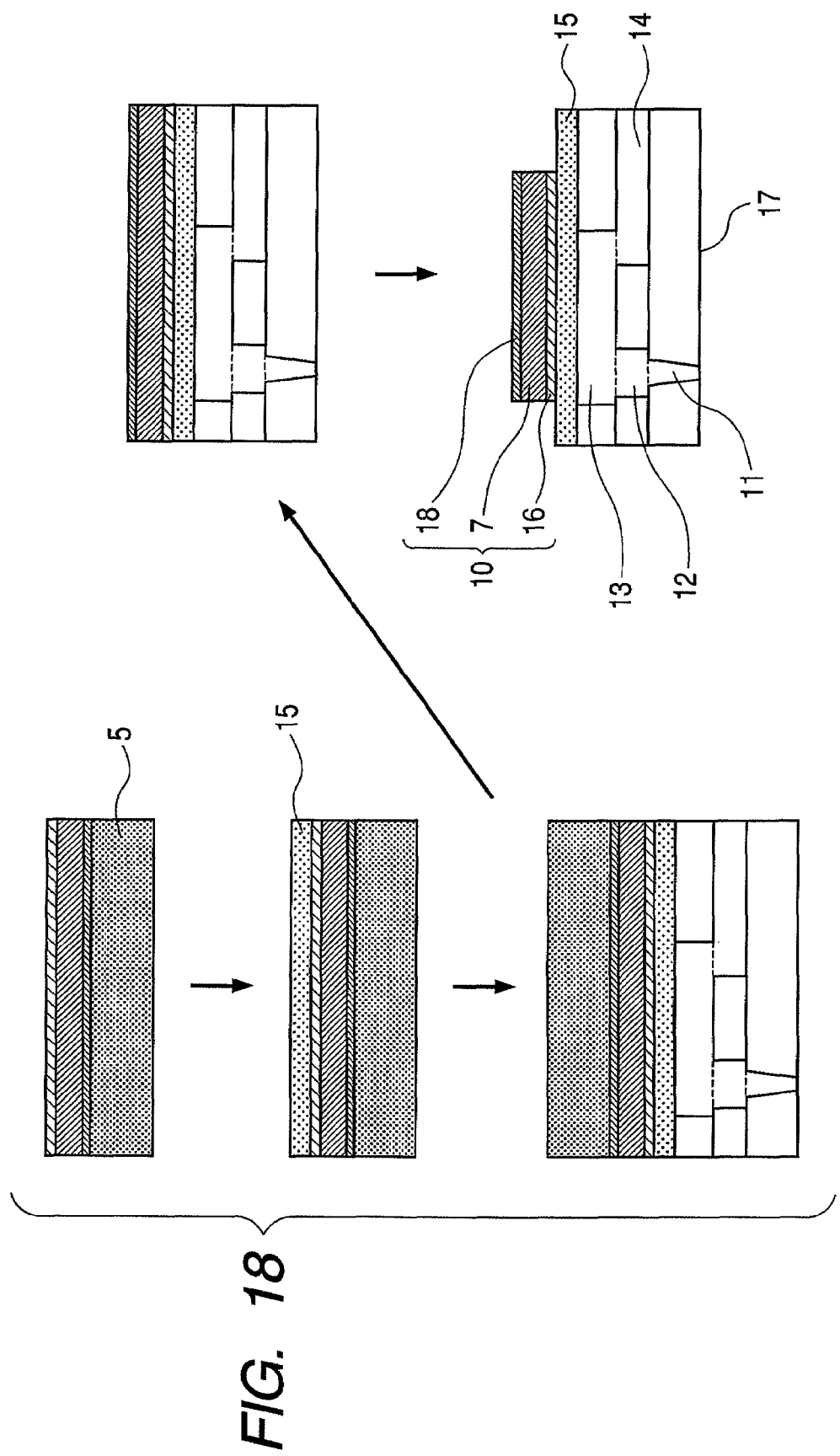
FIG. 18 is a schematic view illustrating an example of the producing process for the liquid discharge head of the present invention.

As the second method, as illustrated in FIG. 18, a piezoelectric element 10 is formed on a substrate 5 as in the producing method for the piezoelectric element. Then, in a state where the piezoelectric element 10 is not yet patterned, prepared is a substrate on which a vibrating plate 15 is formed as a film on the piezoelectric element. Then, a substrate bearing an individual liquid chamber 13, a substrate bearing a communicating hole 12 and a common liquid chamber 14, and a substrate bearing a discharge port 11 are prepared separately, and after these substrates are laminated, the vibrating plate and the piezoelectric element are transferred from the above-mentioned substrate.

Figure 19:
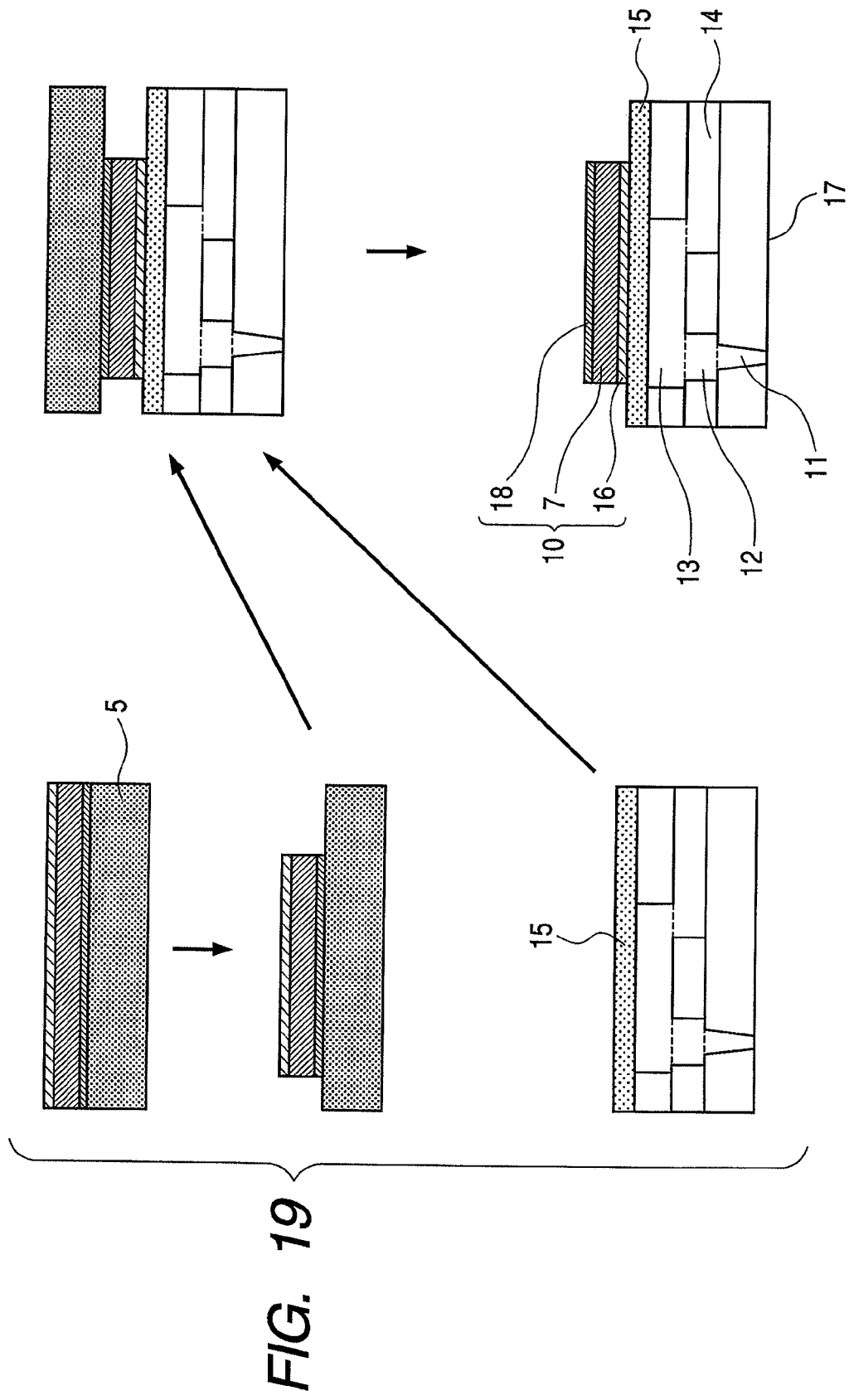
FIG. 19 is a schematic view illustrating an example of the producing process for the liquid discharge head of the present invention.

In another producing method, as illustrated in FIG. 19, a piezoelectric element 10 is formed on a substrate 5 and is patterned to obtain the piezoelectric element. Then, a substrate bearing a vibrating plate 15 and a part of an individual liquid chamber 13, a substrate bearing a common liquid chamber 14 and a communicating hole 12, and a substrate bearing a discharge port 11 are prepared separately. After these substrates are laminated, the piezoelectric element 10 is transferred from the above-mentioned substrate to obtain a liquid discharge head.

For adjoining at the transfer, a method of utilizing an inorganic adhesive or an organic adhesive may be used, but a metallic adjoining by an inorganic material is more preferable. Examples of the metallic adjoining include In, Au, Cu, Ni, Pb, Ti, Cr and Pd. Use of such material enables an adjoining at a low temperature of 300° C. or lower, and reduces the difference in the thermal expansion coefficient with the substrate, thereby avoiding a problem caused by a bending of the piezoelectric element when the element is made into a longer dimension and reducing the damage to the piezoelectric element.

Figure 20A:
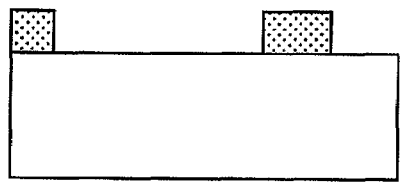
FIGS. 20A, 20B, 20C, 20D, 20E and 20F are schematic views illustrating an example of the producing process for the liquid discharge head of the present invention.
Figure 20B:
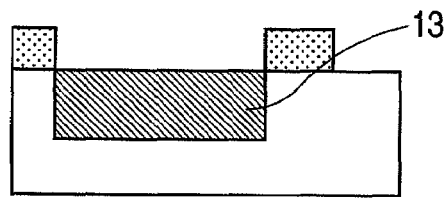
Figure 20C:
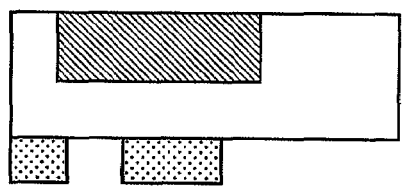
Figure 20D:
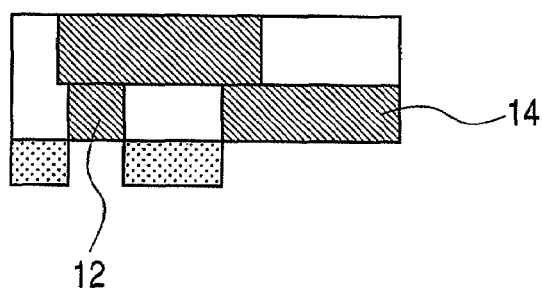
Figure 20E:
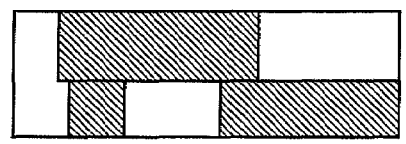
Figure 20F:
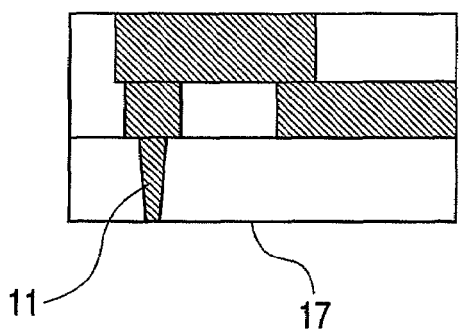

The communicating hole 12 and the common liquid chamber 14 in the first method, and the individual liquid chamber 13, the communicating hole 12 and the common liquid chamber 14 in the second method can be formed for example by working a forming member (substrate). For such working, utilizable are a method including a step of patterning the forming member (substrate) by a lithographic process and a step of removing a part of the member by an etching. For example, in the second method, the individual liquid chamber 13, the communicating hole 12 and the common liquid chamber 14 can be formed by steps as shown in FIGS. 20A to 20F, in which FIG. 20A indicates a step of forming a mask for the individual liquid chamber 13, FIG. 20B indicates a step of working the individual liquid chamber 13 by etching etc. from above (hatched portion indicating a portion to be worked), FIG. 20C indicates a step of removing the mask used for forming the individual liquid chamber 13 and forming a mask for the communicating hole 12 and the common liquid chamber 14, FIG. 20D indicates a step of working the communicating hole 12 and the common liquid chamber 14 by etching etc. from below, and FIG. 20E schematically illustrates a state where removing the mask used for forming the communicating hole 12 and the common liquid chamber 14 whereby the individual liquid chamber 13, the communicating hole 12 and the common liquid chamber 14 are formed. The discharge port 11 is formed by an etching, a mechanical working or a laser working on a substrate 17. FIG. 20F illustrates a state where the substrate 17 bearing the discharge port 11 is adjoined, after the state of FIG. 20E, to the substrate bearing the individual liquid chamber 13, the communicating hole 12 and the common liquid chamber 14. The surface of the substrate 17 bearing the discharge port is preferably subjected to a water-repellent treatment. The adjoining method for the substrates is similar to that at the transfer, but it may also be an anodic oxidation adjoining.

In the second method, the separate substrate onto which the piezoelectric element 10 of the substrate 5 is transferred is preferably in a state as shown in FIGS. 20E to 20F. When the vibrating plate is formed on the piezoelectric element on the substrate 5, the transfer is executed directly on the individual liquid chamber 13 in the state as shown in FIGS. 20E 50 20F. When the vibrating plate is not formed on the piezoelectric element on the substrate 5, the vibrating plate is formed after filling the hole of the individual liquid chamber 13, in the state as shown in FIGS. 20E to 20F, with a resin, and the transfer is executed after the vibrating plate is completed by removing the resin by an etching. In this case, the vibrating plate is preferably formed by a thin film forming method such as a sputtering method or a CVD. The patterning step of the piezoelectric element 10 may be executed before or after the transfer.

In the following, the liquid discharge apparatus of the present invention will be described. The liquid discharge apparatus of the present invention is equipped with the liquid discharge head of the present invention.

Figure 24:
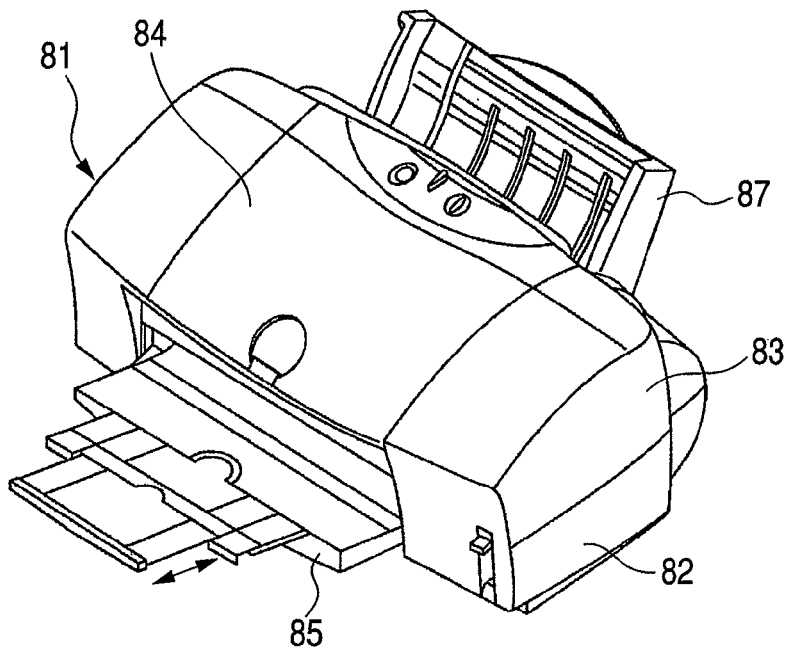
FIG. 24 is a perspective view illustrating an example of a liquid discharge apparatus.
Figure 25:
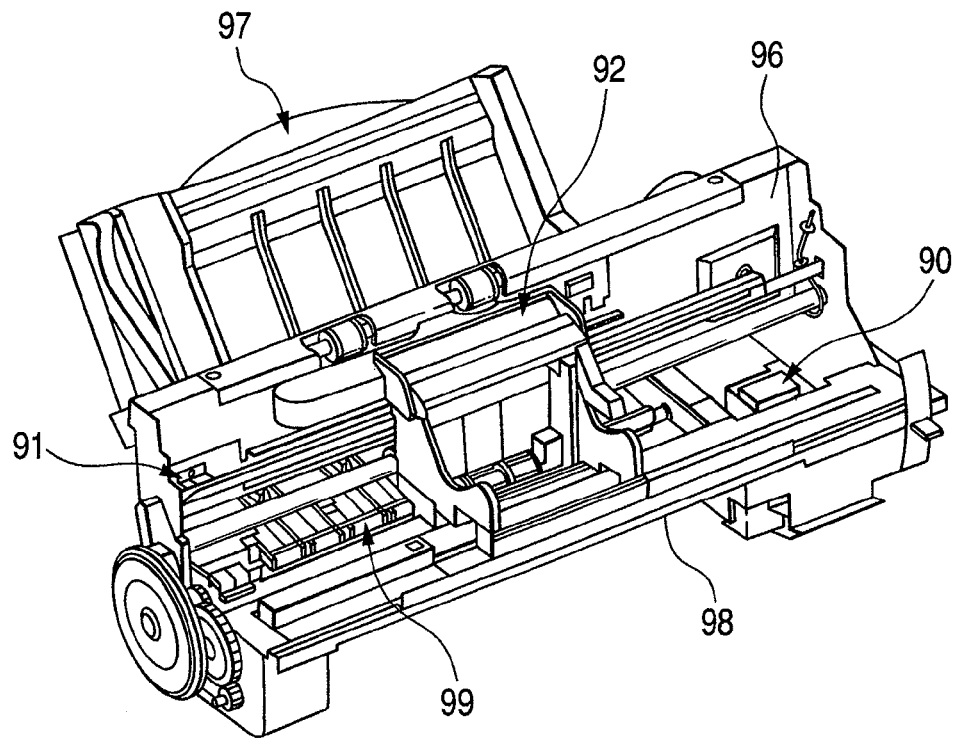
FIG. 25 is a perspective view illustrating an example of a liquid discharge apparatus.

As an example of the liquid discharge apparatus of the present invention, FIGS. 24 and 25 illustrate an ink jet recording apparatus. FIG. 25 illustrates a state where outer casings 82-85 and 87 are detached from a liquid discharge apparatus (ink jet recording apparatus) 81 illustrated in FIG. 24. The ink jet recording apparatus 81 includes an automatic feeding portion 97 for automatically feeding a recording sheet, constituting a recording medium, into a main body 96 of the apparatus. It further includes a conveying portion 99 for guiding the recording sheet, fed from the auto feeding portion 97, to a predetermined recording position, and further guiding it from the recording position to a discharge opening 98, a recording portion 91 for executing recording on the recording sheet conveyed to the recording position, and a recovery portion 90 for executing a recovery process on the recording portion 91. The recording portion 91 includes a carriage 92 which accommodates the liquid discharge head of the present invention and is reciprocated on a rail.

In such ink jet recording apparatus, when the carriage 92 is moved on the rail and a driving voltage is applied to the electrodes sandwiching the piezoelectric member by an electrical signal transmitted from a computer, the piezoelectric member causes a deviation, and such deviation of the piezoelectric member pressurizes each pressure chamber across the vibrating plate 15 illustrated in FIG. 13, thereby discharging the ink from the discharge port 11 to execute a recording.

The liquid discharge apparatus of the present invention is capable of discharging the liquid uniformly at a high speed, and enables compactification of the apparatus.

The foregoing exemplary embodiment has been described as a printer, but the liquid discharge apparatus of the present invention is applicable not only to an ink jet recording apparatus for use in a facsimile apparatus, a composite equipment or a copying apparatus, but also to a liquid discharge apparatus for industrial use.

(Evaluation of Piezoelectric Property)

Figure 21:
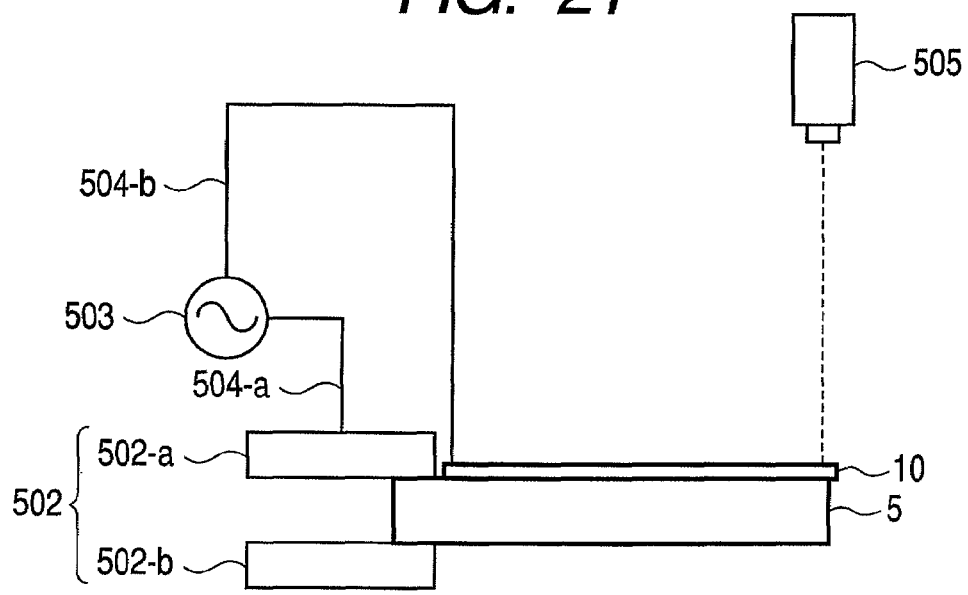
FIG. 21 is a schematic view illustrating an evaluation method for the piezoelectric property.
Figure 22:
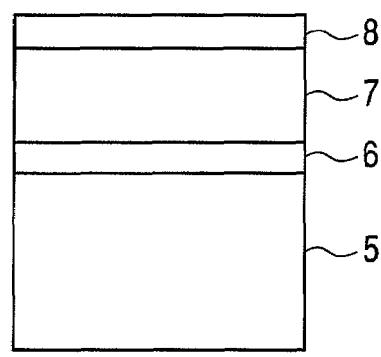
FIG. 22 is a schematic view illustrating an evaluation method for the piezoelectric property.
Figure 23:
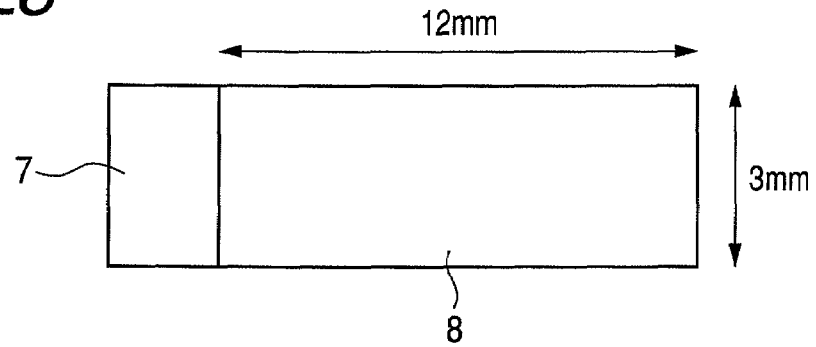
FIG. 23 is a schematic view illustrating an evaluation method for the piezoelectric property.

The piezoelectric property of the piezoelectric element of the present invention was evaluated by a $d_{31}$ measuring method utilizing a unimorph type cantilever. The method and construction for measurement are outlined in FIGS. 21, 22 and 23. A piezoelectric element 10, constituted of a lower electrode film 16, a piezoelectric member 7 and an upper electrode film 18 on a substrate 5, has a construction of a unimorph type cantilever of which one side is fixed by a clamping jig 502. An upper side portion 502-a of the clamping jig 502 is formed of a conductive material, electrically contacted with the lower electrode film 16 of the piezoelectric member 7 and is connected, by an electrical cable 504-a, to an output terminal (not illustrated) of an AC source 503. Another output terminal (not illustrated) of the AC source 503 is connected through an electrical cable 504-b to the upper electrode film 18, thereby capable of applying an AC voltage to the piezoelectric member 7.

By an electric field supplied by the AC source 503, the piezoelectric element 10 causes an extension-contraction deviation. As a result, the substrate 5 is distorted, and the unimorph type cantilever vibrates in the vertical direction, with an end portion fixed by the clamping jig 502 as a fulcrum. In such state, the vibration of the unclamped end of the piezoelectric element 10 is monitored by a laser Doppler velocity meter (LDV) 505 whereby the deviation of the unimorph type cantilever is measured as a function of the input electric field.

In this state, the deviation of the unimorph type cantilever is approximately correlated with the input voltage V as represented by an equation 1 (cf. J. G. Smith, W. Choi, The constituent equations of piezoelectric heterogeneous bimorph, IEEE trans. Ultrason. Ferro. Freq. Control 38 (1991) 256-270; Non-Patent Reference 4).

The equation 1 does not contain terms for physical properties such as of the lower electrode film, the upper electrode film and the buffer layer, but, when the thickness hs of the substrate is sufficiently smaller than the thicknesses of these layers, the physical properties and the thicknesses of these layers are negligible and the equation 1 constitutes a practically sufficient approximation.

Equation 1

$$\delta = 3d_{31}S_{11}{}^s S_{11}{}^P h^s (h^s + h^P) L^2 V/K \qquad \text{equation 1-1}$$

$$K = (S_{11}{}^s)^2 (h^P)^4 + 4S_{11}{}^s S_{11}{}^P h^s (h^P)^3 + 6S_{11}{}^s S_{11}{}^P (h^s)^2 (h^P)^2 + 4S_{11}{}^s S_{11}{}^P (h^s)^3 h^P + (S_{11}{}^P)^2 (h^s)^4 \qquad \text{equation 1-2}$$

wherein:

δ deviation of end of cantilever
V input voltage
L length of cantilever
$S_{11}{}^s$ compliance of substrate (11 components)
$S_{11}{}^P$ compliance of piezoelectric member (11 components)
$h^s$ thickness of substrate
$h^P$ thickness of piezoelectric member Based on the equations 1, $d_{31}$ of the piezoelectric element can be determined by measuring the deviation of the unimorph type cantilever as a function of the input electric field.

EXAMPLES

In the following, the piezoelectric member, the piezoelectric element and the liquid discharge head utilizing the piezoelectric element, of the present invention, will be further clarified by examples.

Example 1

A piezoelectric member of Example 1 was prepared in the following procedure.

On a $SrTiO_3$ {100} substrate, a $SrRuO_3$ (SRO) film was formed with a thickness of 200 nm by sputtering with a substrate temperature of 600° C., to obtain a substrate bearing a lower SRO electrode film. Then a PTO film constituting the piezoelectric member was formed on the substrate by a pulsed MOCVD method. The film forming process was as follows.

Figure 11:
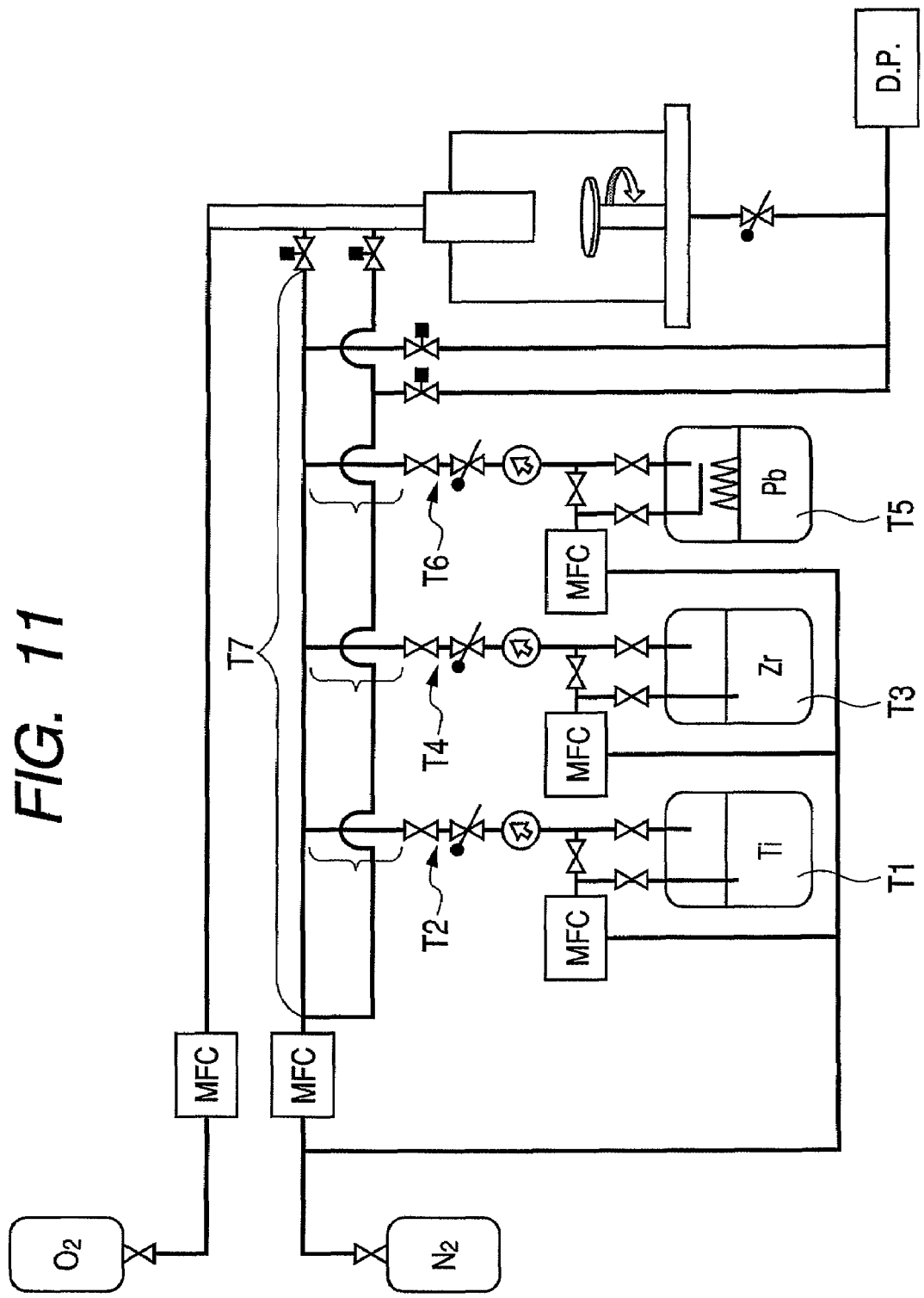
FIG. 11 is a view illustrating an exemplary construction of a producing apparatus for the piezoelectric member.

In an apparatus illustrated in FIG. 11, the substrate on a substrate holder was heated at 600° C. under rotation at 2.0 rpm. The raw material gas for Pb was $Pb(thd)_2$, and that for Ti was $Ti(OC_3H_7\text{-i})_4$. The flow rates of the raw material gases for Pb and Ti were respectively selected as 20 and 35 cm³/min. The inert gas was $N_2$, with a flow rate of 45 cm³/min during the gas supply time in the pulsed MOCVD, and 100 cm³/min during the raw material non-supply time. Also the flow rate of oxygen was selected as 100 cm³/min, equal to the flow rate of the starting material mixed gas and the inert gas. The temperature of the gas supply line was exactly regulated, in positions T1, T2 and T5-T7 illustrated in FIG. 11, respectively at 40, 150, 142, 180 and 200° C. In the pulsed cycle of the raw material gas, a raw material non-supply time of 5 seconds was formed after a raw material gas supply time of 10 seconds, and this cycle was repeated to obtain a perovskite type PTO epitaxial film of a thickness of 2.0 µm was obtained. The film forming gas pressure was selected as 5 Torr. Prior to the supply of the raw material gases, the raw materials were subjected to a bubbling for 70 minutes.

Then the composition and the crystal structure of the piezoelectric member of Example 1 were analyzed. The elementary ratio Pb/Ti of PTO was 1.0, based on a compositional analysis by an induction-coupled plasma light emission analyzer (ICP compositional analysis). Also a 2θ/θ measurement by X-ray diffraction detected reflective peaks only resulting from {00L} plane (L=1, 2, 3, . . . , n: n being an integer) of the perovskite structure of PTO, and a polar measurement on an asymmetric plane {202} showed reflective peaks in a 4-times symmetry. Based on these results, it was confirmed that the piezoelectric member was an epitaxial film having a PTO perovskite structure of <100> orientation. Also based on an inverse lattice measurement by X-ray diffraction, it was confirmed that all the domains in PTO were tetragonal crystals with a=3.90, and c=4.15. Also polar measurements were conducted by X-ray diffraction on (002), (200), in-plane (002) and in-plane (200) of PTO (FIGS. 7 and 8). As a result, domains A, B, C, D and E as illustrated were observed.

These domains had following relationships:
the angular deviation between the [001] direction of the domain A and the [001] direction of the domain B was 0.7°;
the angular deviation between the [100] direction of the domain C and the [100] direction of the domain D was 0.7°;
the angular deviation between the [100] direction of the domain D and the [100] direction of the domain E was 0.7°;
the angular deviation between the [100] direction of the domain C and the [100] direction of the domain E was 0°;
the angular deviation between the [001] direction of the domain C and the [001] direction of the domain E was 3.6°; and
the angular deviation between the [001] direction of the domain D and the [001] direction of the domain E was 3.0°.

Also within the domains A, B, C, D and E, the domains A and B represented a proportion of 60%.

On the piezoelectric member, Ti and Pt were sputtered as an electrode film, in succession with respective thicknesses of 4 nm and 150 nm, thereby producing the piezoelectric element of Example 1.

Example 2

A piezoelectric member of Example 2 was prepared in the following procedure.

A SrTiO₃ substrate having a lower SRO electrode, similar to the substrate in Example 1, was employed. Then a PZT film constituting the piezoelectric member was formed on this substrate by a pulsed MOCVD method. The film forming process was as follows.

As in Example 1, in an apparatus illustrated in FIG. 11, the substrate on a substrate holder was heated at 600° C. under rotation at 2.0 rpm. The raw material gas for Pb was Pb(thd)₂, that for Zr was Zr(OC₄H₉-i)₄ and that for Ti was Ti(OC₃H₇-i)₄. The flow rates of the raw material gases for Pb, Zr and Ti were respectively selected as 50, 70 and 35 cm³/min. The inert gas was N₂, with a flow rate of 45 cm³/min during the gas supply time in the pulsed MOCVD, and 200 cm³/min during the raw material non-supply time. Also the flow rate of oxygen was selected as 200 cm³/min, equal to the flow rate of the starting material mixed gas and the inert gas. The temperature of the gas supply line was exactly regulated, in positions T1-T7 illustrated in FIG. 11, respectively at 40, 150, 36, 150, 142, 180 and 200° C. In the pulsed cycle of the raw material gas, a raw material non-supply time of 5 seconds was formed after a raw material gas supply time of 10 seconds, and this cycle was repeated to obtain a perovskite type PZT epitaxial film of a thickness of 2.0 µm was obtained. The film forming gas pressure was selected as 5 Torr. Prior to the supply of the raw material gases, the raw materials were subjected to a bubbling for 70 minutes.

Then the composition and the crystal structure of the piezoelectric member of Example 2 were analyzed in the same manner as in Example 1. As a result of ICP compositional analysis, Pb/(Zr+Ti) was 1.0, and Zr/(Zr+Ti) was 0.45. Also based on an X-ray diffractometry as in Example 1, it was confirmed that the piezoelectric member was an epitaxial film having a PZT perovskite structure of <100> orientation. Also based on an inverse lattice measurement by X-ray diffraction, it was confirmed that all the domains in PZT were tetragonal crystals with a=4.00, and c=4.15. Also polar measurements were conducted by X-ray diffraction on (002), (200), in-plane (002) and in-plane (200) of PZT. These domains had following relationships:

the angular deviation between the [001] direction of the domain A and the [001] direction of the domain B was 0.6°;
the angular deviation between the [100] direction of the domain C and the [100] direction of the domain D was 0.6°;
the angular deviation between the [100] direction of the domain D and the [100] direction of the domain E was 0.6°;
the angular deviation between the [100] direction of the domain C and the [100] direction of the domain E was 0°;
the angular deviation between the [001] direction of the domain C and the [001] direction of the domain E was 2.1°; and
the angular deviation between the [001] direction of the domain D and the [001] direction of the domain E was 1.8°.

Also within the domains A, B, C, D and E, the domains A and B represented a proportion of 680%.

On the piezoelectric member, Ti and Pt were sputtered as an electrode film, in succession with respective thicknesses of 4 nm and 150 nm, thereby producing the piezoelectric element of Example 2.

Comparative Example 1

A piezoelectric member of Comparative Example 1 was prepared in the following procedure.

A SrTiO₃ substrate having a lower SRO electrode, similar to the substrate in Example 1, was employed.

Then a PTO film constituting the piezoelectric member was formed on this substrate by a pulsed MOCVD method. The film forming process was as follows.

As in Example 1, in an apparatus illustrated in FIG. 11, the substrate on a substrate holder was heated at 600° C. under rotation at 8.3 rpm. The raw material gas for Pb was Pb(thd)₂, and that for Ti was Ti(OC₃H₇-i)₄. The flow rates of the raw material gases for Pb and Ti were respectively selected as 20 and 35 cm³/min. The inert gas was N₂, with a flow rate of 45 cm³/min during the gas supply time in the pulsed MOCVD, and 100 cm³/min during the raw material non-supply time. Also the flow rate of oxygen was selected as 50 cm³/min. The temperature of the gas supply line was exactly regulated, in positions T1, T2, T5-T7 illustrated in FIG. 11, respectively at 40, 170, 142, 170 and 200° C. In the pulsed cycle of the raw material gas, a raw material non-supply time of 8 seconds was formed after a raw material gas supply time of 12 seconds, and this cycle was repeated to obtain a perovskite type PTO epitaxial film of a thickness of 2.0 μm was obtained. The film forming gas pressure was selected as 5 Torr, and, prior to the supply of the raw material gases, the raw materials were subjected to a bubbling for 70 minutes.

Then the composition and the crystal structure of the piezoelectric member of Comparative Example 1 were analyzed in the same manner as in Examples 1 and 2. In the piezoelectric member of Comparative Example 1, the domains A, B, C and D could confirmed, but the domain E could not be confirmed. Also, within the domains A, B, C, D and E, the domains A and B represented a proportion of 60%. On the piezoelectric member, Ti and Pt were sputtered as an electrode film, in succession with respective thicknesses of 4 nm and 150 nm, thereby producing the piezoelectric element of Comparative Example 1. FIGS. 12A and 12B illustrate results of (200) and (002) polar measurements under application of an electric field of 200 kV/cm, in Example 1 (FIG. 12A) and Comparative Example 1 (FIG. 12B). For the measurement, utilized was a beam line (BL13XU) of a large-scale light radiation facility (SPring-8) of High Intensity Optical Science Research Center. Under the application of an electric field of 200 kV/cm, it was confirmed that the piezoelectric element of Example 1 showed a decrease of the domains C and E and an increase of the domain B by the electric field application, in comparison with that of Comparative example 1. It could thus be confirmed that the piezoelectric element of Example 1 caused more 90° domain switching under a lower electric field.

Table 1 illustrates results of measurement of piezoelectric constant on the piezoelectric elements of Examples 1 and 2 and Comparative Example 1. The piezoelectric constant was measured by the $d_{31}$ measuring method utilizing a unimorph type cantilever method. The sample for $d_{31}$ measurement was prepared by forming the upper electrode 18 of the piezoelectric element into a rectangular pattern of 12 mm×3 mm, and by cutting with a dicer into a shape illustrated in FIG. 23. In this state, in the piezoelectric elements on the SrTiO₃ {100} substrates of Examples 1 and 2 and Comparative Example 1, the upper electrode 18 was so disposed that the sides of the rectangular shape were parallel to the <100> direction of the SrTiO₃ {100} substrate.

In the present exemplary embodiment, $d_{31}$ was determined under following conditions.

As an input signal voltage to the sample, a sinusoidal wave of 500 Hz was given to the piezoelectric element so as to apply an electric field of 0-150 [kV/cm] to the piezoelectric element 10 (corresponding to a voltage application of 0-45 V to the piezoelectric member of thickness of 3 μm). Then $d_{31}$ was determined by measuring the deviation δ at the end of the cantilever obtained by such input signal voltage. The polarity of voltage was selected in such a manner that the deviation became maximum under the same electric field. A sinusoidal wave was selected as the input signal voltage, since the cantilever had a large mass, in order to remove an inertial term in the vibrational movement from the deviation δ of the end of the cantilever.

The physical properties used in the equations 1 were as follows:

$S11s = 3.8 \times 10^{-12} [m^2/N]$ $S11p = 10.0 \times 10^{-12} [m^2/N]$

TABLE 1

|  | Example 1 | Example 2 | Comparative Example 1 |
|---|---|---|---|
| piezoelectric constant (pC/N) | −220 | −195 | −169 |

As shown in Table 1, a high piezoelectric property could realized in the piezoelectric elements of Examples 1 and 2.

Example 3

A liquid discharge head of Example 3 was prepared in the following manner.

An SOI substrate bearing an epitaxial Si film of 500 nm and an SiO₂ film of 500 nm was employed as the substrate. The surface of the Si {100} substrate was treated with hydrofluoric acid, then a ZrO₂ film doped with Y was formed by sputtering with a thickness of 100 nm at a substrate temperature of 800° C., and a CeO₂ film was formed with a thickness of 60 nm at a substrate temperature of 600° C. Both were single crystal films of <100> orientation. Then a LaNiO₃ (LNO) film was formed, as a lower electrode film, by sputtering with a thickness of 100 nm at a substrate temperature of 300° C. On the LNO film, a SrRuO₃ (SRO) film was formed with a thickness of 200 nm at a substrate temperature of 600° C., thereby obtaining a substrate having a lower electrode film etc. The electrode film and the SRO film were single crystal films of <100> orientation.

Subsequently, a piezoelectric element was prepared in the same manner as in Example 1, except for utilizing the aforementioned substrate bearing the lower electrode film etc., and, after a patterning of the actuator portion, the Si substrate of the handle layer was dry etched by an induction-coupled plasma method (ICP method) to form vibrating plates and individual liquid chambers. Then the substrate was adjoined with another Si substrate on which a common liquid chamber and communicating holes were formed. In this manner, prepared was a liquid discharge head in which the vibrating plate was formed by the SiO₂ layer, the Si film, the ZrO₂ film doped with Y, and the CeO₂ film. The liquid discharge head was driven by an application of a driving signal, and a central portion of the individual liquid chamber of the liquid discharge head was irradiated, from the side of the upper electrode, with a laser beam of 20 μmφ, and the amount of deviation of the liquid discharge head was evaluated by a laser Doppler system. As a result, the liquid discharge head of the present embodiment provided a deviation as large as 0.25 μm. Also this liquid discharge head exhibited deviations satisfactorily following the drive signals of even $10^8$ times.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-053507, filed Mar. 2, 2007, which is hereby incorporated by reference herein in its entirety.

What is claimed is:

1. A piezoelectric member of an epitaxial oxide of <100> orientation having at least a tetragonal crystal structure, constituted of a perovskite type composite oxide represented by a general formula $ABO_3$, which comprises at least domains C, D and E of [100] orientation having a deviation in crystal direction one another, wherein an angular deviation between a [100] direction of the domain C and a [100] direction of the domain D is 5° or less, an angular deviation between a [100] direction of the domain D and a [100] direction of the domain E is 5° or less, an angular deviation between a [100] direction of the domain C and a [100] direction of the domain E is 0.3° or less, an angular deviation between a [100] direction of the domain D and a [100] direction of the domain E is 0.3° or more, an angular deviation between a [001] direction of the domain C and a [001] direction of the domain E is 1.0° or more, and an angular deviation between a [001] direction of the domain D and a [001] direction of the domain E is 1.0° or more.

2. A piezoelectric member according to claim 1, further comprising, in addition to the domains C, D and E, at least domains A and B of [001] orientation having a deviation in crystal direction one another, wherein an angular deviation between a [001] direction of the domain A and a [001] direction of the domain B is 5° or less.

3. A piezoelectric member according to claim 2, wherein the domains A, B, C, D and E are tetragonal crystals, and at least domains B, C, D and E have a same lattice constant.

4. A piezoelectric member according to claim 3, wherein the domains B and D have a mirror image relationship of a twin crystal, with a {110} twin plane, and the domains C and E have a mirror image relationship of a twin crystal, with a {110} twin plane.

5. A piezoelectric member according to claim 1, which comprises lead titanate or lead zirconate titanate as a principal component.

6. A piezoelectric member according to claim 1, comprising a thickness of 0.6 μm or larger.

7. A piezoelectric element comprising a piezoelectric member according to claim 1, and a pair of electrodes in contact with the piezoelectric member.

8. A liquid discharge head comprising:

a discharge port;

a liquid chamber communicating with the discharge port;

a piezoelectric element disposed in correspondence with the liquid chamber; and a vibration plate disposed between the liquid chamber and the piezoelectric element, and adapted to discharge a liquid in the liquid chamber by a volume change in the liquid chamber, wherein the piezoelectric element is a piezoelectric element according to claim 7.

9. A liquid discharge apparatus comprising a liquid discharge head according to claim 8.

* * * * *